United States Patent
Whang et al.

(10) Patent No.: US 9,728,377 B2
(45) Date of Patent: Aug. 8, 2017

(54) PLASMA PROCESSING DEVICE CAPABLE OF PLASMA SHAPING THROUGH MAGNETIC FIELD CONTROL

(71) Applicant: Seoul National University R&DB Foundation, Seoul (KR)

(72) Inventors: Ki Woong Whang, Seoul (KR); Hee Woon Cheong, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/100,388

(22) PCT Filed: Nov. 28, 2014

(86) PCT No.: PCT/KR2014/011557
§ 371 (c)(1),
(2) Date: May 31, 2016

(87) PCT Pub. No.: WO2015/080516
PCT Pub. Date: Jun. 4, 2015

(65) Prior Publication Data
US 2016/0300697 A1    Oct. 13, 2016

(30) Foreign Application Priority Data

Nov. 29, 2013 (KR) .................. 10-2013-0147172
Nov. 25, 2014 (KR) .................. 10-2014-0164948

(51) Int. Cl.
*H01J 37/32* (2006.01)

(52) U.S. Cl.
CPC ........ *H01J 37/321* (2013.01); *H01J 37/3266* (2013.01); *H01J 37/32669* (2013.01)

(58) Field of Classification Search
CPC ............... H01J 37/32458; H01J 37/321; H01J 37/3211; H01J 37/32119
See application file for complete search history.

(56) References Cited

U.S. PATENT DOCUMENTS 5,587,205 A * 12/1996 Saito ................... C23C 16/511
                                                                        118/723 MA
6,268,700 B1   7/2001 Holland et al.
(Continued)

FOREIGN PATENT DOCUMENTS

JP      2002289595 A   10/2002
KR      100178847 B1    5/1999
(Continued)

*Primary Examiner* — Douglas W Owens
*Assistant Examiner* — James H Cho
(74) *Attorney, Agent, or Firm* — The Webb Law Firm

(57) ABSTRACT

A plasma processing device capable of plasma shaping through magnetic field control includes: a vacuum chamber having an inner space on which a substrate is mounted; an antenna positioned on the upper portion of the chamber and generating plasma in the inner space of the chamber; a magnetic field generation unit including a first magnetic field generation unit disposed on the lower portion of the chamber and including one or more electromagnetic coils and a second magnetic field generation unit including one or more electromagnetic coils disposed on the side of the chamber; and a control unit controlling current input into the electromagnetic coils of the magnetic field generation unit.

8 Claims, 29 Drawing Sheets

(56) References Cited

U.S. PATENT DOCUMENTS

| | | | |
|---|---|---|---|
| 6,573,190 B1 * | 6/2003 | Izawa | H01J 37/321 |
| | | | 156/345.42 |
| 6,620,334 B2 | 9/2003 | Kanno | |
| 6,673,199 B1 | 1/2004 | Yamartino et al. | |
| 2006/0061287 A1 * | 3/2006 | Jeon | H01J 37/321 |
| | | | 315/111.21 |

FOREIGN PATENT DOCUMENTS

| KR | 100558182 B1 | 7/2006 |
|---|---|---|
| KR | 1020090037343 A | 4/2009 |
| WO | 2009048294 A2 | 4/2009 |

* cited by examiner

—Prior Art—

—Prior Art—

—Prior Art—

−Prior Art−

FIG. 24

| | FIRST MAGNETIC FIELD GENERATION CONDITIONS | | SECOND MAGNETIC FIELD GENERATION CONDITIONS | | THIRD MAGNETIC FIELD GENERATION CONDITIONS | | DIRECTION | | B(substrate) |
|---|---|---|---|---|---|---|---|---|---|
| | Lower 1 | Lower 2 | Lateral 1 | Lateral 2 | Upper 1 | Upper 1 | B(radial) | B(axial) | |
| Case 1 | N/A | N/A | 250mA | 250mA | N/A | N/A | Const. | ⇨ | 7Gauss |
| Case 2 | -750mA | N/A | 500mA | 500mA | N/A | N/A | ⇦ | ⇦ | |
| Case 3 | N/A | -750mA | 500mA | 500mA | N/A | N/A | ⇦ | ⇨ | |
| Case 4 | -750mA | -750mA | 750mA | 750mA | N/A | N/A | ⇦ | ⇦ | |
| Case 5 | -750mA | 350mA | 350mA | 350mA | 350mA | 350mA | ⇦ | ⇦ | |
| Case 6 | 330mA | -750mA | 330mA | 330mA | 330mA | 330mA | ⇦ | ⇦ | |
| Case 7 | 140mA | 140mA | 140mA | 140mA | 140mA | 140mA | ⇨ | ⇨ | |

PLASMA PROCESSING DEVICE CAPABLE OF PLASMA SHAPING THROUGH MAGNETIC FIELD CONTROL

CROSS-REFERENCE TO RELATED APPLICATIONS

This application is the United States national phase of International Application No. PCT/KR2014/011557 filed Nov. 28, 2014, and claims priority to Korean Patent Application Nos. 10-2013-0147172 and 10-2014-0164948, filed Nov. 29, 2013 and Nov. 25, 2014, respectively, the disclosures of which are hereby incorporated in their entirety by reference.

TECHNICAL FIELD

The present invention relates to a plasma processing device capable of plasma shaping through magnetic field control, and more particularly, to a plasma processing device that disposes electromagnetic coils which are a plurality of magnetic field generation units and increases uniformity of plasma through plasma shaping in a chamber by controlling a magnetic field through current control of each coil.

BACKGROUND ART

As a plasma generating device, a capacitively coupled plasma source and an inductively coupled plasma source and helicon using a plasma wave and a microwave plasma source are generally proposed. Among them, the inductively coupled plasma source which can easily form high-density plasma is widely used.

FIG. 1 illustrates an inductively coupled plasma generation device and in the inductively coupled plasma generation unit 10, a substrate to be processed is mounted on a substrate holder 16 in a receiving space in a chamber 15, reaction gas is supplied into the chamber, and an antenna 17 connected with an RF power source is installed on the upper portion of the chamber 15, and as a result, when power is applied to the antenna 17 from an impedance matched RF power source, RF power, that is, an RF potential and current are applied to the antenna 17. The applied RF potential forms an electric field which varies according to a time in a direction parallel to a dielectric isolating the antenna 17, the RF current that flows on the antenna 17 forms a magnetic field in an inner space of the reaction chamber 15, and an inductive electric field is formed by the magnetic field.

In this case, the reaction gas in the chamber 15 acquires sufficient energy required for ionization from the inductively generated electric field to form plasma. The formed plasma is injected into the substrate installed in the substrate holder 16 to process the substrate. The plasma is generally referred to as inductively coupled plasma (ICP) and a device using the same is referred to as an inductively coupled plasma processing device.

It is preferred to increase a plasma density by considering a throughput of a plasma processing process and pressure lowering of a process for overcoming a contaminated particle generation problem and a scheme is presented, in which since the density of the plasma formed in the chamber 15 is further increased by an inductive electric field by a magnetic field than the electric field formed in the chamber 15, a permanent magnet is disposed outside the chamber 15 in order to further increase the plasma density to include multiple magnetic field generation units 11, 12, and 13 (Korean Patent Unexamined Publication No. 10-2009-37343).

However, in the case of the plasma processing device using the magnetic field regardless of the permanent magnet or an electromagnet using a coil, it is difficult to uniformly control the plasma densities of the center and the outer periphery of the inner space of the chamber, and as a result, reliability of a product quality by performing the plasma processing process may deteriorate and for example, the density of the plasma decreases in proportion to the distance in the outward direction from the center of the chamber during the plasma processing process of the substrate, and as a result, the plasma is not appropriately processed, thereby causing a fault and in particular, non-uniformity of an etching or deposition process due to non-uniformity of the plasma density may be a more serious problem while processing a large-area substrate.

Therefore, a scheme that can increase uniformity of the plasma density throughout the center and the outer periphery of the substrate while acquiring a high plasma density is required in the inductively coupled plasma device using the magnetic field.

DISCLOSURE

Technical Problem

The present invention is contrived to solve the problem in the related, which is described above and the present invention has been made in an effort to solve a problem in that reliability of product production deteriorates due to performing a plasma processing process because plasma densities of the center and the outer periphery of an inner space of a chamber are not uniform and are different from each other in the case of an inductively coupled high-density plasma processing device using a magnetic field.

Further, the present invention has been made in an effort to further improve a quality of a process which allows a uniform plasma density to be acquired throughout the center and the outer periphery of a substrate while increasing a plasma density by controlling a magnetic field so as to suppress occurrence of flute instability by increasing the intensity of the magnetic field in proportion to the distance in the outward direction in a horizontal direction based on the substrate in the inner space of the chamber and increase the intensity of the magnetic field in proportion to the distance in the upward direction in a vertical direction based on the substrate to propagate an R-wave into a chamber.

Technical Solution

In order to achieve the technical object, a plasma processing device according to the present invention includes: a vacuum chamber having an inner space on which a substrate is mounted; an antenna positioned on the upper portion of the chamber and generating plasma in the inner space of the chamber; a magnetic field generation unit including a first magnetic field generation unit disposed on the lower portion of the chamber and including one or more electromagnetic coils and a second magnetic field generation unit including one or more electromagnetic coils disposed on the side of the chamber; and a control unit controlling current input into the respective electromagnetic coils of the magnetic field generation unit so as to continuously increase the intensity of the magnetic field in proportion to the distance in the outward direction in a horizontal space and increase the intensity of the magnetic field in proportion to the distance in the upward direction in a vertical space in an effective plasma space of the chamber based on the center of the substrate mounted in the chamber.

Herein, the control unit may control the current input into at least one coil among the coils of the first magnetic field generation unit in an opposite direction to the current input into the coils of the second magnetic field generation unit.

Preferably, the control unit may control the current input into the respective electromagnetic coils so as to generate a predetermined magnetic field intensity at the center of the substrate in the effective plasma space of the chamber.

Further, the first magnetic field generation unit may include a plurality of electromagnetic coils disposed on the bottom of the chamber, the respective electromagnetic coils may be installed to be spaced apart from each other outside the bottom of the substrate mounted in the chamber to sequentially have larger radii, and the control unit may control the current input into at least one selected coil among the plurality of coils included in the first magnetic field generation unit in an opposite direction to the current input into the residual coils.

Meanwhile, the first magnetic field generation unit may include a plurality of electromagnetic coils disposed on the bottom of the chamber, and the respective electromagnetic coils may be installed to be spaced apart from each other outside the bottom of the substrate mounted in the chamber to sequentially have larger radii, and the second magnetic field generation unit may include a plurality of electromagnetic coils disposed to be spaced apart from each other in a vertical direction of the chamber to surround the periphery of the side of the chamber, and the control unit may control current input into one or more selected electromagnetic coils among the plurality of electromagnetic coils included in the first magnetic field generation unit in an opposite direction to the current input into the electromagnetic coils of the second magnetic field generation unit.

Furthermore, the plasma processing device according to the present invention may further include a third magnetic field generation unit disposed on the upper portion of the chamber and including one or more electromagnetic coils, wherein the control unit may control current input into the electromagnetic coils of the third magnetic field generation unit in the same direction as the current input into the electromagnetic coils of the second magnetic field generation unit.

Further, the plurality of electromagnetic coils of the second magnetic field generation unit may be installed within a range from the outside of an RF window provided on the top of the chamber to a horizontal space of the bottom surface of the chamber.

Advantageous Effects

According to the present invention, uniformity of plasma is improved throughout an inner space of a chamber, and as a result, a plasma process having high reliability can be performed even around the outer periphery of a substrate and in particular, a plasma process for a large-area substrate can be more stably performed.

Further, according to the present invention, a uniform plasma density is be acquired throughout the center and the outer periphery of a substrate while a plasma density is increased by controlling a magnetic field so as to suppress occurrence of flute instability by increasing the intensity of the magnetic field in proportion to the distance in the outward direction in a horizontal direction based on the substrate in the inner space of the chamber and increase the intensity of the magnetic field in proportion to the distance in the upward direction in a vertical direction based on the substrate to propagate an R-wave into a chamber, thereby further improving a quality of a process.

DESCRIPTION OF DRAWINGS

FIG. 24 illustrates a result depending on a representative control condition in each case of the first and second comparative examples and the first to fifth embodiments.

BEST MODE

Figure 1:
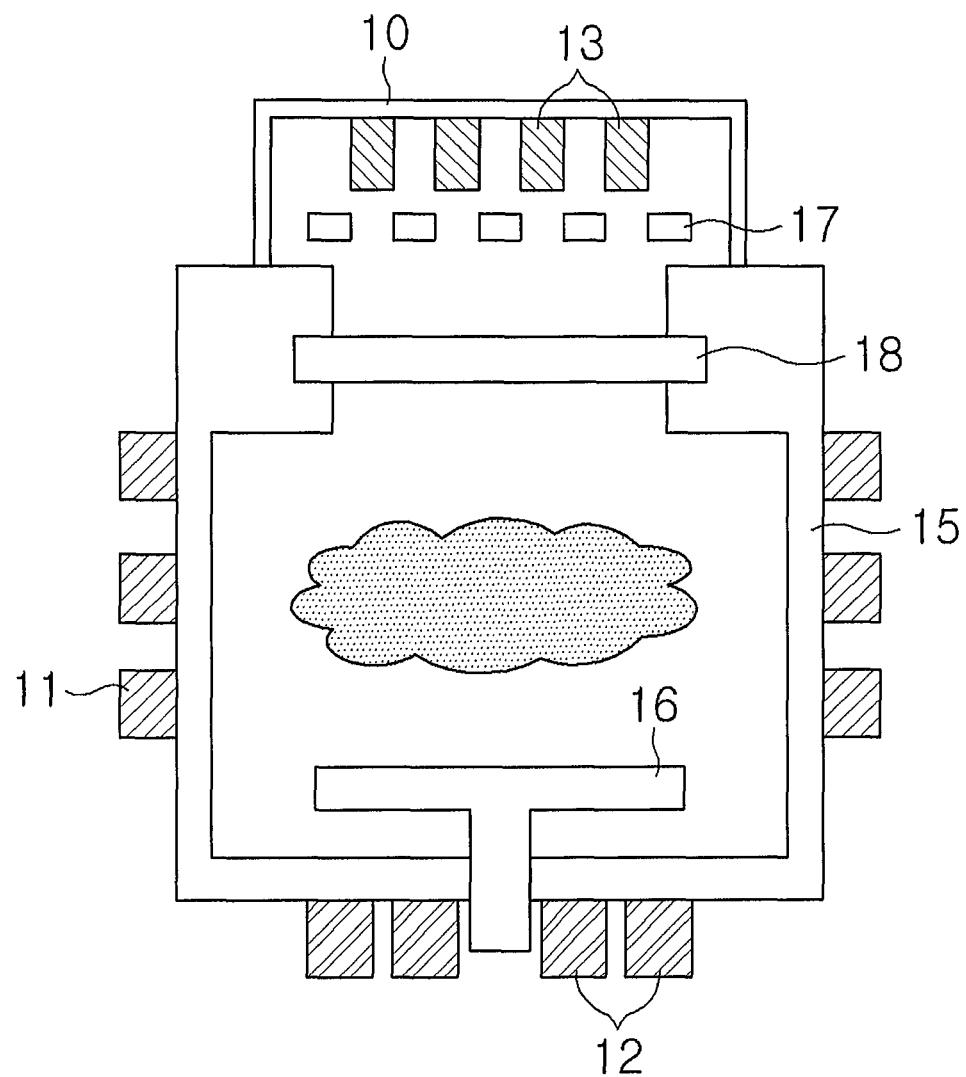
FIG. 1 illustrates an inductively coupled plasma generation device.

The present invention, operational advantages of the present invention, and objects achieved by executing the present invention will be, hereinafter, described by exemplifying embodiments of the present invention and referring to the exemplary embodiments.

First, terms used in the present application are just used to describe a specific embodiment and are not intended to limit the present invention and a singular expression may include a plural expression as long as it is not apparently contextually different. Further, in the present application, it should be understood that the term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

In the description of the present invention, the detailed descriptions of known related constitutions or functions thereof may be omitted if it is determined that they make the gist of the present invention unclear.

The present inventor calls a device that includes an antenna for generating inductively coupled plasma and applies a magnetic field by a coil apart therefrom to acquire high-density plasma by using characteristics of magnetized plasma as a magnetized inductively coupled plasma (M-ICP) device and a previous patent registration No. 10-178847 of the present inventor is cited for a basic configuration of the M-ICP device.

The present invention presents a scheme that determines a spatial distribution of a magnetic field in a chamber according to the number and positions of electromagnetic coils, and the intensity and an application direction of current in the magnetized inductively coupled plasma (M-ICP) device, disposes an appropriate number of eletromagnets at optimal positions in order to form a optimized distribution of the magnetic field to maximize an effect of the M-ICP device, and shapes plasma by magnetic field control through control of each electromagnet.

In the M-ICP device, a discharge characteristic of plasma may remarkably vary with the spatial distribution of the magnetic field in a horizontal direction or a vertical direction based on a substrate even though a magnetic flux density applied to the center of the substrate is uniform. In particular, the present inventor observes that non-uniformity of a plasma density which may be problematic according to the distribution of the magnetic field occurs due to a phenomenon called flute instability in the M-ICP device and as a result of deriving a scheme for solving the non-uniformity and performing a continuous experiment, a remarkable action effect is verified to reach the present invention.

When the flute instability is first described for appreciation of the technical spirit of the present invention, in the case where the magnetic field is applied on a system in which a gradient of the plasma density is present, the phenomenon called the flute instability may occur under a special situation.

The flute instability is called even Rayleigh-Taylor instability or interchange instability and is revealed through a research into plasma nuclear fusion. Referring to a conceptual view of the flute instability illustrated in FIG. 2, the flute instability as a phenomenon which may occur by a gravitational field F which is applied in an opposite direction to the gradient of the density generated by the magnetized plasma may be regarded to be similar to, for example, a phenomenon which occurs due to presence of gravity when a heavier liquid is above a light liquid.

Figure 2:
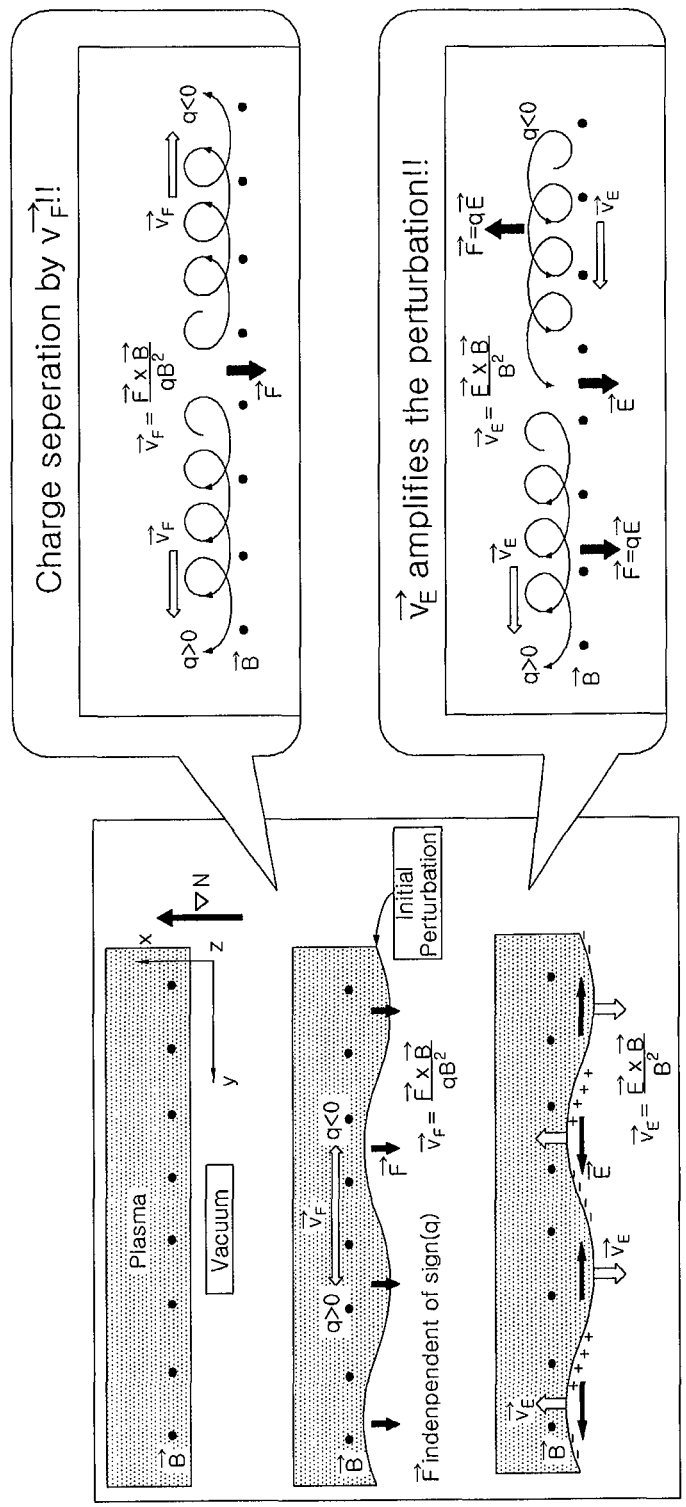
FIG. 2 illustrates a conceptual view of flute instability which occurs in a plasma processing device.

When it is assumed that the gravitational field F which is not influenced by a charge sign is applied vertically to a magnetic field B, while electrons and ions are drifted in opposite directions to each other by the gravitational field F, charge separation occurs. As a result, as illustrated in FIG. 2, while an electric field E is formed and $\vec{E} \times \vec{B}$ drift occurs, perturbation is amplified, and consequently, the phenomenon called the flute instability occurs.

In a process plasma generation device to which the magnetic field is applied, a curved magnetic field serves as the gravitational field.

Since the gradient of the density of the plasma becomes unstable due to the occurrence of the flute instability, the uniformity of the plasma density deteriorates in the inner space of the chamber, and as a result, reliability of the plasma process deteriorates.

The plasma perturbation phenomenon called the flute instability occurs when the gradient signs of the density and the magnetic field are the same as each other as shown in [Equation 1] given below.

$$\vec{F} = \vec{F_\mu} + \vec{F_c} = -m\left(\frac{v_\perp^2}{2} + v_\parallel^2\right)\nabla_\perp \ln B \quad \text{[Equation 1]}$$

$$\langle \vec{F} \rangle =$$

$$\int \frac{d\vec{v} f_0 \vec{F}}{d\vec{v} f_0} = -2T\nabla_\perp \ln B \leftrightarrow \nabla n \cdot \nabla B > 0 \text{: Flute instability}$$

In general, since the plasma density decreases in a radial direction due to radial diffusion or loss on a wall, if even a radial magnetic field intensity decreases, the flute instability phenomenon occurs, and as a result, the non-uniformity of the plasma density may further deteriorate (see A. B. Mikhailovskii, Theory of plasma instabilities, Volume 2: Instabilities of an inhomogeneous plasma).

The present inventor may stably acquire the uniform density of plasma distribution without the flute instability as a result of performing an experiment by making an opposite situation to prevent the non-uniformity of the plasma density from being deteriorated due to the flute instability phenomenon, that is, forming the magnetic field distribution that increases the intensity of the magnetic field in the radial direction by considering that the non-uniformity of the plasma density, which occurs due to the magnetic field distribution in the M-ICP device may deteriorate due to the flute instability phenomenon by a combination of a plasma density reduction effect in an outer radial direction and a reduction effect of the radial magnetic field intensity.

Accordingly, the occurrence of the flute instability is removed by controlling the spatial distribution of the magnetic field in the chamber in the present invention and in particular, the intensity of the magnetic field increases in proportion to the distance in the outward direction of a horizontal space in an effective plasma space of the chamber based on the substrate of the chamber according to [Equation 1] to remove the occurrence of the flute instability.

Herein, the effective plasma space as a space in which plasma performing the plasma process is present on the substrate mounted on the chamber means a space in the chamber, which includes a horizontal space end to a vertical space end of the chamber based on the substrate. The effective plasma space may mean a space including a horizontal space having a larger length than the substrate by a predetermined length and a vertical space having a predetermined height from the substrate based on the substrate in the chamber by considering the size of the substrate on which the process is to be performed according to the situation.

Meanwhile, a vertical magnetic field intensity may decrease or increase through appropriate layout or control of the electromagnets and the present inventor observes that when the intensity of the magnetic field increases in proportion to the distance in the upward direction in the vertical space based on the substrate in the effective plasma space of the chamber, the density may be further increased by improving efficiency of the generation of the plasma in the space of the chamber.

Figure 3:
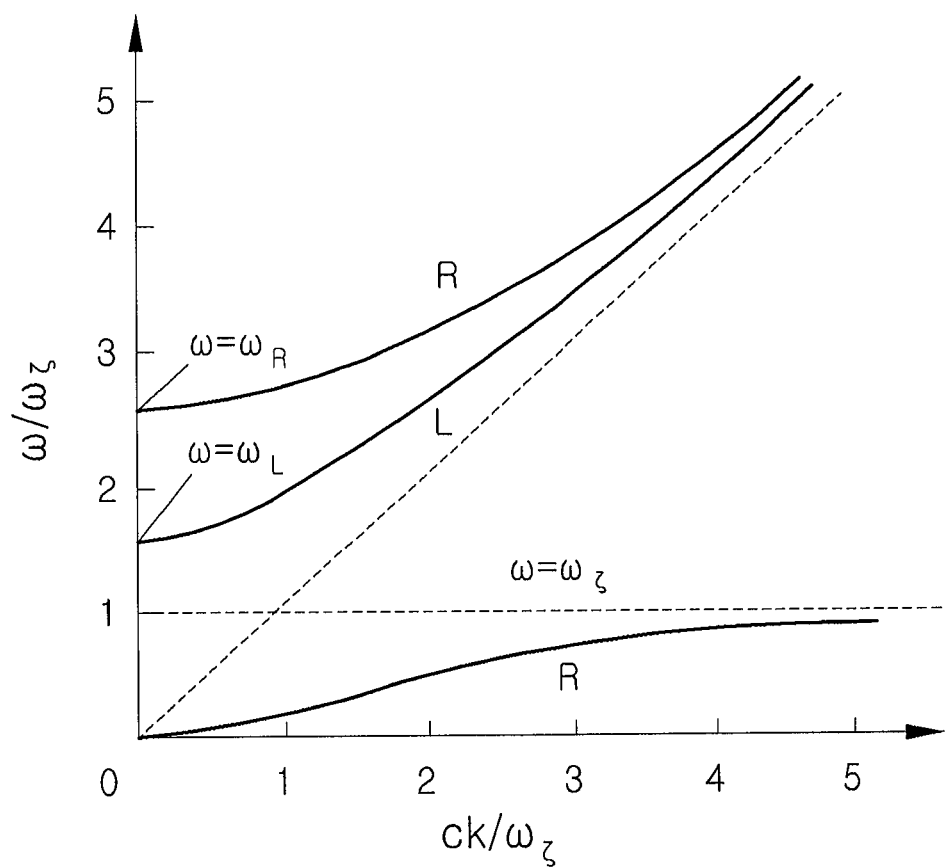
FIG. 3 illustrates an R-wave dispersion relation.
Figure 4:
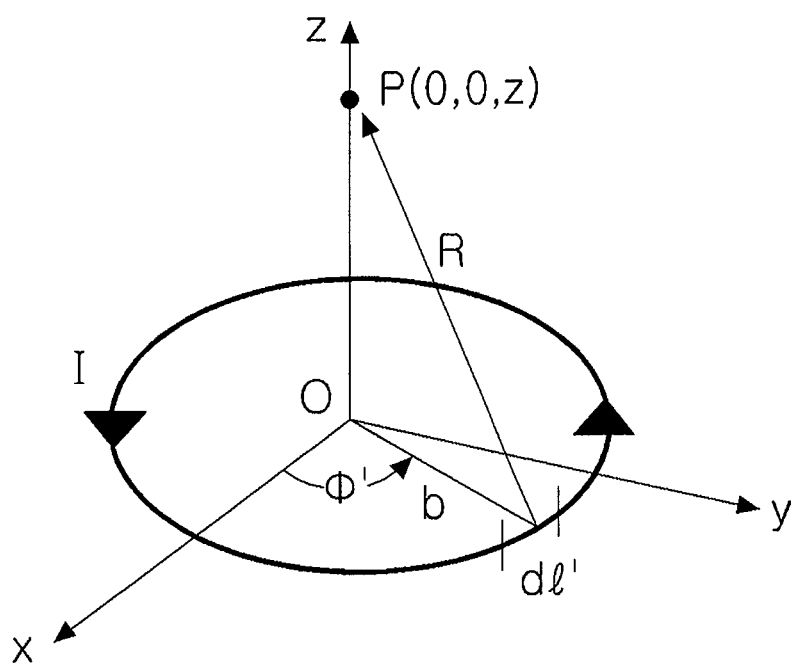
FIG. 4 illustrates a conceptual view for a magnitude of a magnetic field according to a Biot-Savart's law.

The reason is that by considering an R-wave graph of FIG. 3, only when the magnetic field in the vertical direction increases, in-chamber propagation of an R-wave is facilitated, and as a result, electron heating by electron cyclotron resonance (ECR) is enabled, thereby increasing the plasma generation efficiency.

In the M-ICP device according to embodiments to be described below, the electron cyclotron resonance (ECR) generated by applying the electric field may be used as an acceleration energy source of electrons and to this end, when a radio frequency (RF) generator having a frequency of 27.12 MHz is used, the magnetic flux density is approximately 9.6 Gauss, an effect thereof may be expected. In the case of a microwave based ECR plasma device having a frequency of 2.45 GHz, a tremendous intensity of magnetic field that reaches approximately 1 kG is required, but in the case where radio frequency (RF) generator having the frequency of 27.12 MHz is used, the magnetic field of a minimum several Gauss (based on ICP) to a maximum of approximately 30 Gauss may just be applied to the center of the substrate, and as a result, a turn number or current of a magnetic field coil may be further lower, thereby facilitating a hardware configuration.

That is, the plasma process may be smoothly performed with respect to the substrate only by forming the magnetic flux density of a minimum of several Gauss or more at the center of the substrate and when a frequency of several GHz band is used, a larger magnetic flux density may be easily formed at the center of the substrate, but as high current is applied to apply high power as much, a diameter of the magnetic field coil needs to increase and the turn number needs to increase, and as a result, the hardware configuration is not easy, but when a frequency of several to tens of MHz band is used, the diameter of the magnetic field coil relatively decreases and the turn number also decreases by applying relatively lower current, and as a result, the hardware configuration may be easy.

In the following embodiments, as a magnetic field generation unit, a first magnetic field generation unit and a second magnetic field generation unit are fundamentally installed on the lower portion and the side of the chamber, respectively and additionally, a third magnetic field generation unit is installed on the upper portion of the chamber.

The magnetic field distribution depending on the layout, the turn number, and current of electromagnetic coils constituting each magnetic field generation unit may be estimated by calculation, and the like and a magnitude of a magnetic field B determined by current I that flows on a close path C' is expressed as shown in [Equation 2] given below according to a Biot-Savart's law.

$$B = \frac{\mu_o I}{4} \oint_{C'} \frac{dl' \times a_R}{R^2} \; (T) \qquad \text{[Equation 2]}$$

Therefore, when the position of the coil and the current that flows are given based on [Equation 2], the magnitude of the magnetic field at a predetermined position may be predicted.

The number of turns and the positions of the respective coils of the magnetic field generation unit to be applied to the embodiments may be determined based on such a condition and for example, as the first magnetic field generation unit, two coils Lower 1 and Lower 2 are disposed around an exhaust pump on the bottom of the chamber and as the second magnetic field generation unit, a coil Lateral 1 is disposed around the outer periphery of the chamber on the bottom of an RF window and a coil Lateral 2 is disposed around the outer periphery of the chamber on a horizontal line of the substrate, and additionally as the third magnetic field generation unit, a configuration in which coils Upper 1, Upper 2, and Upper 3 are disposed between an antenna box and a matching box may be considered.

In this case, the number of turns of coil of each of Lateral 1 and Lateral 2 which are the second magnetic field generation units having a spatial restriction by a window positioned on the side of the chamber is 1000 and the number of turns of the residual coils included in each of the first magnetic field generation unit and the second magnetic field generation unit is determined as 1400. When the magnetic flux density which each coil applies to the center of the substrate is calculated according to the Biot-Savart's law while assuming that current of 0.7 A is applied to all coils in the same direction, a result shown in [Table 1] given below may be obtained.

TABLE 1

| Position | Radius (m) | Height (m) | Number of turns of coil (times) | Current (A) | Magnetic field (Gauss) |
|---|---|---|---|---|---|
| First magnetic field generation conditions #1 | 0.22-0.24 | 0.21 | 1400 | 0.7 | 10.8 |
| First magnetic field generation conditions #2 | 0.3-0.32 | 0.21 | 1400 | 0.7 | 11.3 |
| Second magnetic field generation conditions #1 | 0.31-0.33 | 0.165 | 1000 | 0.7 | 9.6 |
| Second magnetic field generation conditions #2 | 0.31-0.33 | 0.15 | 1000 | 0.7 | 10.2 |
| Third magnetic field generation conditions #1 | 0.1-0.12 | 0.575 | 1400 | 0.7 | 0.4 |
| Third magnetic field generation conditions #2 | 0.2-0.22 | 0.575 | 1400 | 0.7 | 1.2 |

TABLE 1-continued

| Position | Radius (m) | Height (m) | Number of turns of coil (times) | Current (A) | Magnetic field (Gauss) |
|---|---|---|---|---|---|
| Third magnetic field generation conditions #3 | 0.3-0.32 | 0.575 | 1400 | 0.7 | 2.1 |

Consequently, when the coils under a condition according to [Table 1] given above are disposed, it may be predicted that the magnetic flux density at the center of the substrate in the chamber will be approximately a maximum of 45.6 Gauss. Hereinafter, an experimental result according to the number and the positions of the respective electromagnetic coils constituting each magnetic field generation unit and the intensity and the application direction of current will be described.

Figure 5:
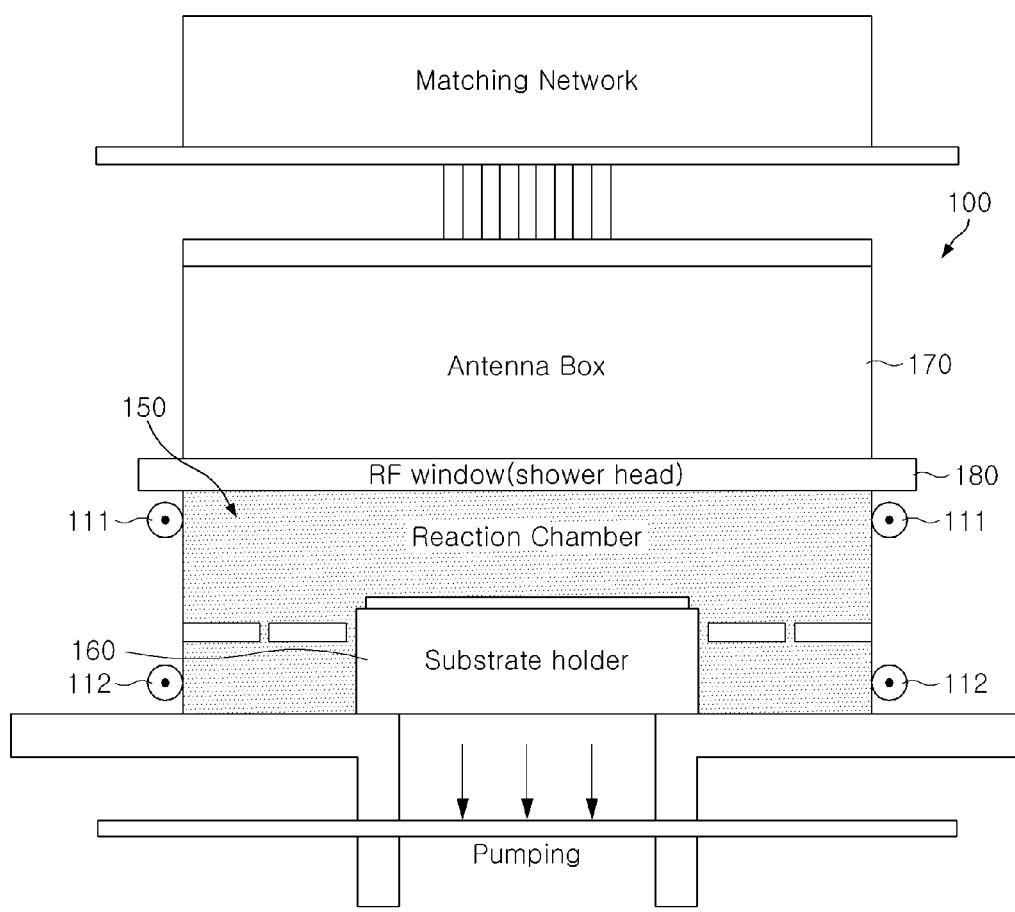
FIG. 5 illustrates a configuration of a first comparative example compared with the plasma processing device according to the present invention.
Figure 6A:
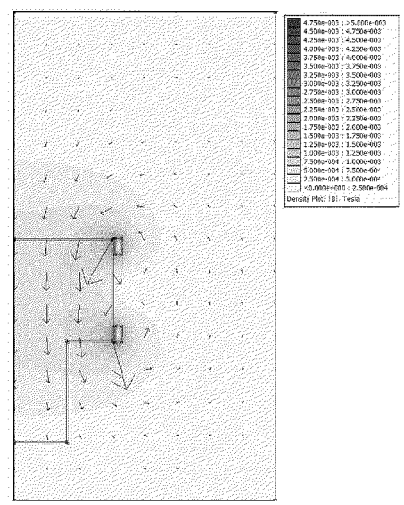
FIGS. 6A to 6D illustrate magnetic flux density distribution diagrams for the first comparative example.
Figure 6B:
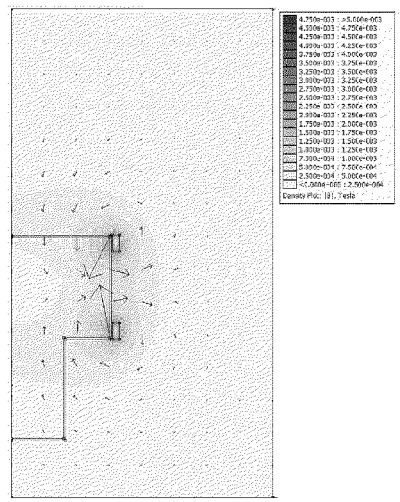
Figure 6C:
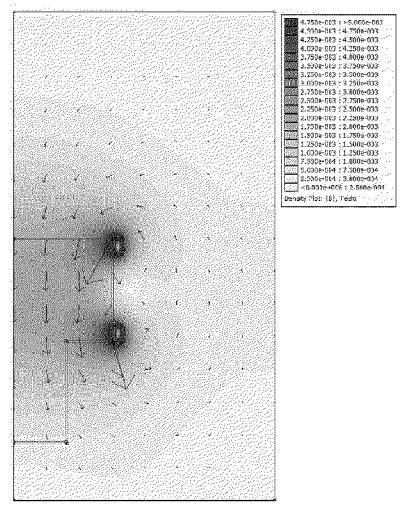
Figure 6D:
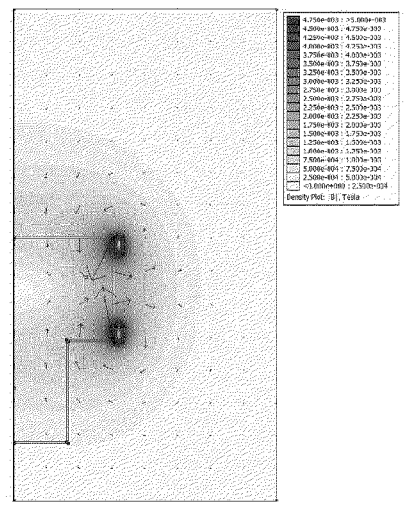

FIG. 5 illustrates a configuration of Case 1 as a first comparative example compared with the plasma processing device of the present invention.

In a plasma processing device 100 of FIG. 5, as the second magnetic field generation unit, coil Lateral 1 111 is disposed around the outer periphery of a chamber 150 on the bottom of an RF window 180 and coil Lateral 2 112 is disposed around the outer periphery of the chamber 150 on a horizontal line of the bottom surface of the chamber 150.

Figure 7A:
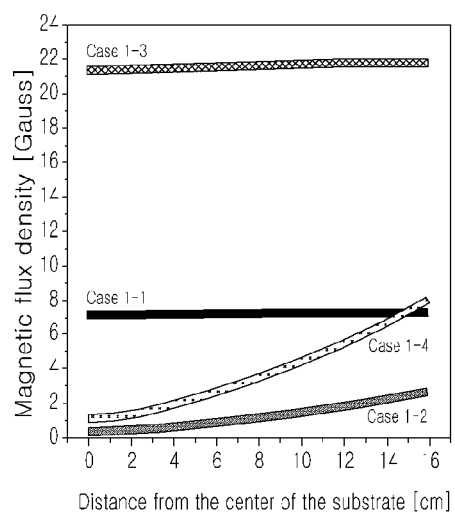
FIGS. 7A and 7B illustrate magnitudes of magnetic field distribution results for the first comparative example.
Figure 7B:
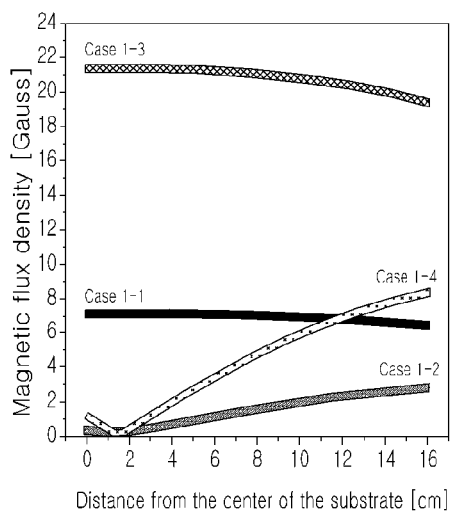

In addition, magnetic flux density distribution diagrams of FIGS. 6A to 6D and magnitudes of magnetic field distribution results of FIGS. 7A and 7B are acquired as a result of measuring a magnetic field distribution in the inner space of the chamber 150 by controlling current input into the second magnetic field generation unit under a current control condition of [Table 2] given below.

TABLE 2

| | Second magnetic field generation conditions | |
|---|---|---|
| | Lateral 1 | Lateral 2 |
| Case 1-1 | 250 mA | 250 mA |
| Case 1-2 | 250 mA | −250 mA |
| Case 1-3 | 750 mA | 750 mA |
| Case 1-4 | 750 mA | −750 mA |

FIGS. 6A, 6B, 6C, and 6D as magnetic flux density distribution diagrams sequentially corresponding to Case 1-1 to Case 1-4 of [Table 2], respectively illustrate magnetic flux density distributions in a right space when cutting the inner space of the chamber 150 on a vertical axis, and FIG. 7A illustrates a magnetic flux density graph in the horizontal direction based on the substrate and FIG. 7B illustrates a magnetic flux density graph in the vertical direction based on the substrate.

When both current supplied to the coil Lateral 1 111 and current supplied to the coil Lateral 1 111 and the coil Lateral 2 112 of the second magnetic field generation unit are controlled in a forward direction under configuration and current conditions of the plasma processing device 100 according to the Case 1-1 to the Case 1-4, since it can be seen that the magnetic field distribution in the horizontal direction may be maintained to be uniform and the vertical magnetic field may be slightly reduced in the case of the Case 1-1 and Case 1-3 as illustrated in FIGS. 7A and 7B, the flute instability phenomenon occurs, and as a result, the plasma density may not be uniformly formed in the entire effective plasma space as described above.

In addition, in the case of Case 1-2 and Case 1-4 in which the current supplied to the coil Lateral 1 111 of the second magnetic field generation unit is controlled in the forward direction and the current supplied to the coil Lateral 2 112 is controlled in a reverse direction as illustrated in FIGS. 7A and 7B, the horizontal magnetic field distribution and the vertical magnetic field distribution increase as being farther from the center of the substrate and in the case of Case 1-2, it can be seen that the magnetic flux density close to 0 Gauss is formed at the center space of the substrate and it can be seen that in the case of Case 1-4, while the magnetic flux density of approximately 1 Gauss is formed at the center space of the substrate, the magnetic flux density increases as being farther from the center of the substrate, but the vertical flux density decreases as being farther from the center of the substrate and reaches approximately 0 Gauss and thereafter, increases again. In such a case, as the magnetic field increases in overall from the center of the substrate, the flute instability phenomenon may be slightly reduced, but since the magnetic flux density is too low at the center space of the substrate, it is substantially impossible to perform the plasma process for the substrate.

Figure 8:
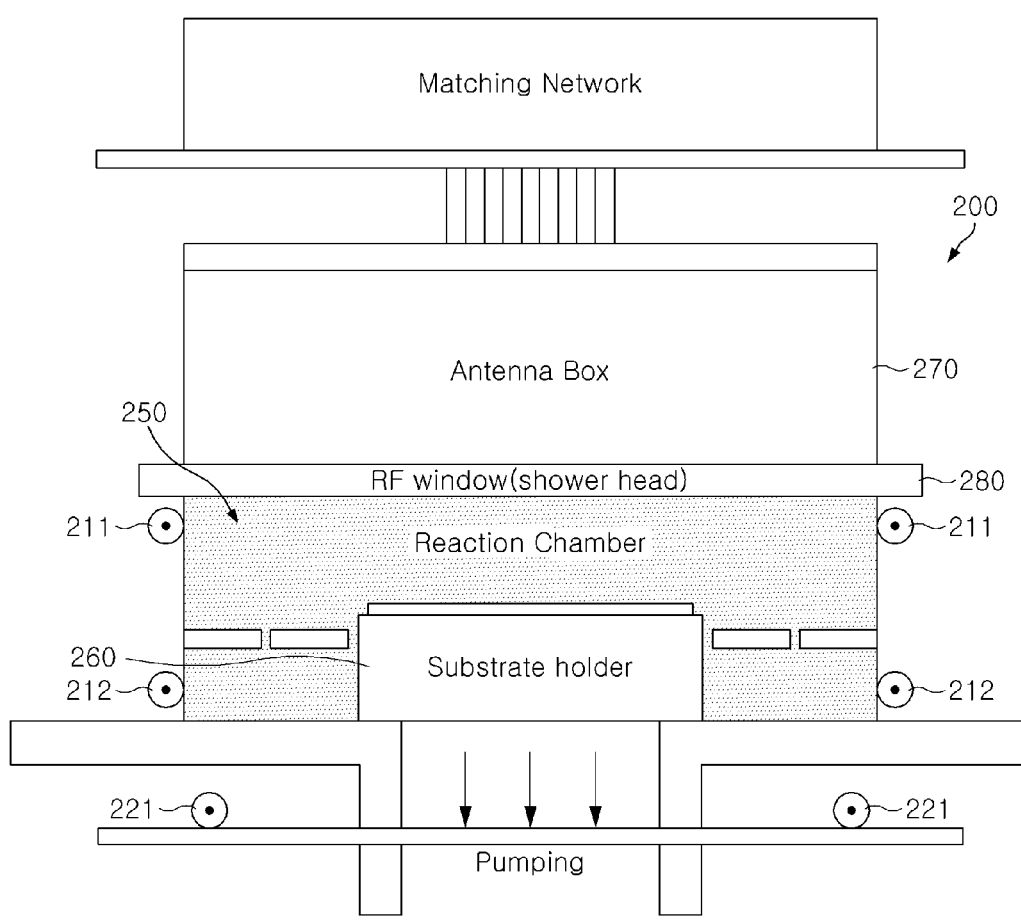
FIG. 8 illustrates a configuration of a first embodiment as one configuration for the plasma processing device according to the present invention.

FIG. 8 illustrates a configuration of Case 2 according to a first embodiment as one example of the plasma processing device according to the present invention. In a plasma processing device 200 of FIG. 8, as the first magnetic field generation unit, one coil Lower 1 221 is disposed outside the vicinity of an intake port of a turbo molecular pump and as the second magnetic field generation unit, coil Lateral 1 211 is disposed around the outer periphery of a chamber 250 on the bottom of an RF window 280 and coil Lateral 2 212 is disposed around the outer periphery of the chamber 250 on a horizontal line of the bottom surface of the chamber 250.

Figure 9A:
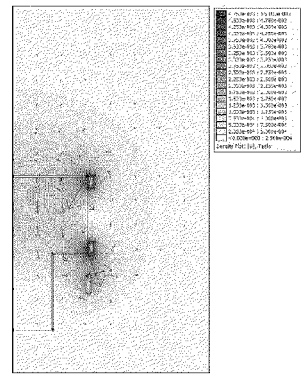
FIGS. 9A to 9C illustrate magnetic flux density distribution diagrams for the first embodiment.
Figure 9B:
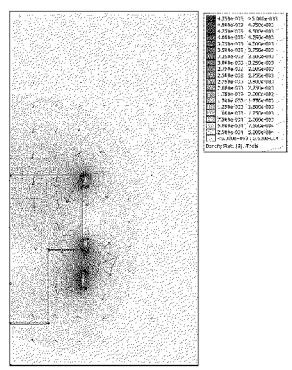
Figure 9C:
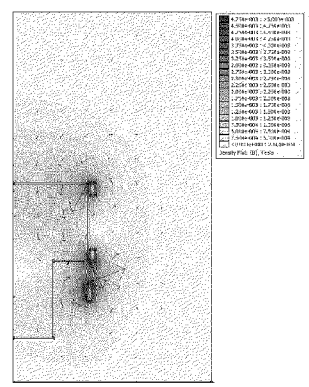
Figure 10A:
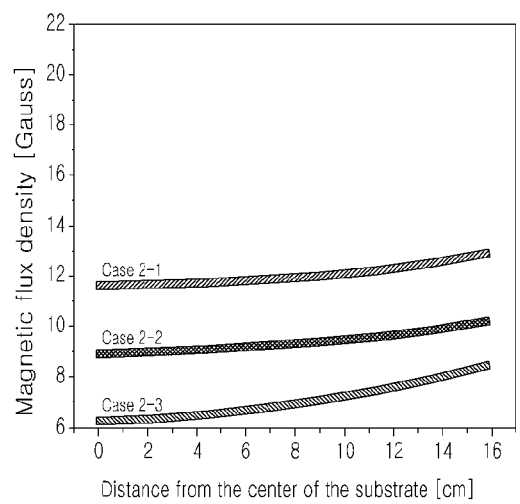
FIGS. 10A and 10B illustrate magnitudes of magnetic field distribution results for the first embodiment.
Figure 10B:
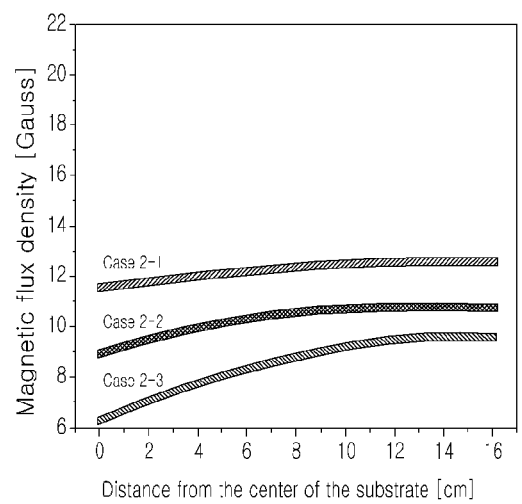

In addition, magnetic flux density distribution diagrams of FIGS. 9A to 9C and magnitudes of magnetic field distribution results of FIGS. 10A and 10B are acquired as a result of measuring the magnetic field distribution in the inner space of the chamber 250 by controlling current input into the first magnetic field generation unit and the second magnetic field generation unit under a current control condition of [Table 3] given below.

TABLE 3

| | First magnetic field generation conditions | Second magnetic field generation conditions | |
|---|---|---|---|
| | Lower 1 | Lateral 1 | Lateral 2 |
| Case 2-1 | −250 mA | 500 mA | 500 mA |
| Case 2-2 | −500 mA | 500 mA | 500 mA |
| Case 2-3 | −750 mA | 500 mA | 500 mA |

FIGS. 9A to 9C as magnetic flux density distribution diagrams sequentially corresponding to Case 2-1 to Case 2-3 of [Table 3], respectively illustrate magnetic flux density distributions in a right space when cutting the inner space of the chamber 250 on a vertical axis, and FIG. 10A illustrates a magnetic flux density graph in the horizontal direction based on the substrate and FIG. 10B illustrates a magnetic flux density graph in the vertical direction based on the substrate.

When current supplied to the coil Lower 1 221 of the first magnetic field generation unit is controlled in a reverse direction different from current supplied to the coils Lateral 1 211 and Lateral 2 212 of the second magnetic field generation unit under configuration and current conditions of the plasma processing device 200 according to the Case 2-1 and the Case 2-3, it can be seen that the horizontal magnetic field intensity continuously increases and further, the vertical magnetic field intensity also gradually increases as illustrated in FIGS. 10A and 10B, and the magnetic flux density is controlled with a minimum of 6 Gauss or more and a maximum of approximately 12 Gauss at the center space of the substrate.

Figure 11:
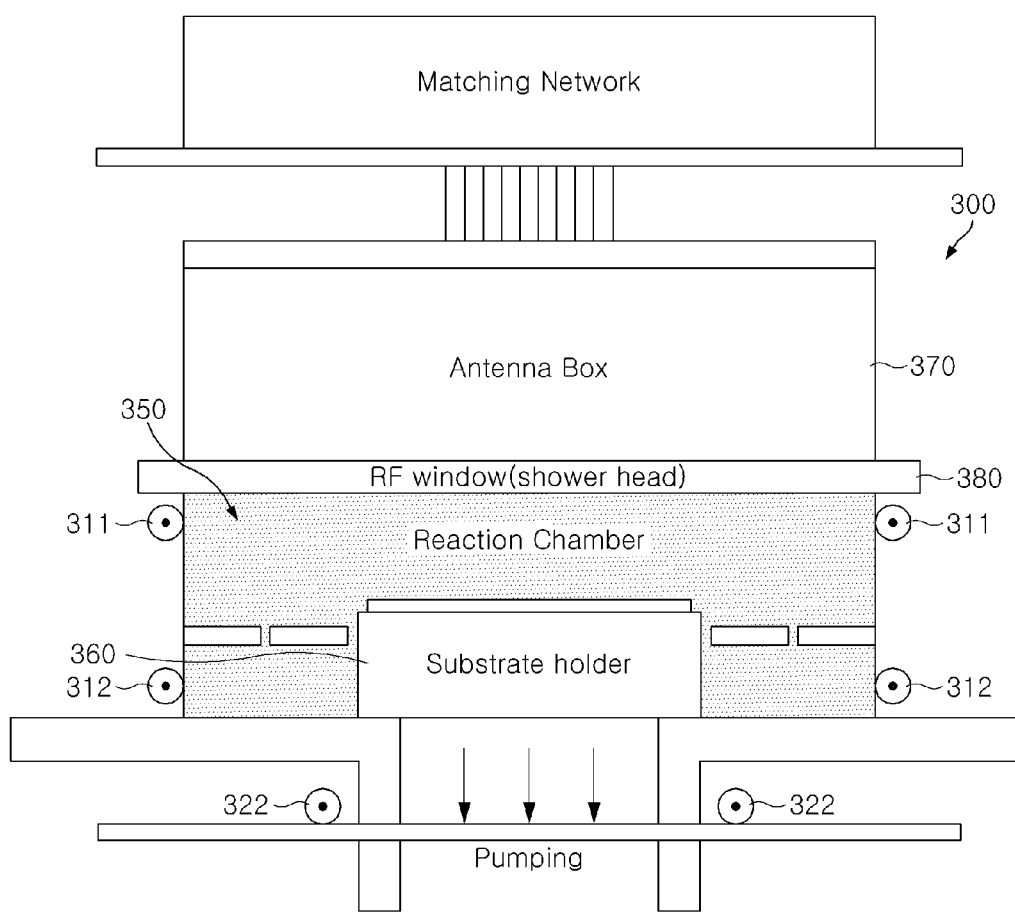
FIG. 11 illustrates a configuration of a second embodiment as one configuration for the plasma processing device according to the present invention.

FIG. 11 illustrates a configuration of Case 3 according to a second embodiment as one example of the plasma processing device according to the present invention.

In a plasma processing device 300 of FIG. 11, as the first magnetic field generation unit, one coil Lower 2 322 is disposed adjacent to the vicinity of the intake port of the turbo molecular pump and as the second magnetic field generation unit, coil Lateral 1 311 is disposed around the outer periphery of a chamber 350 on the bottom of an RF window 380 and coil Lateral 2 312 is disposed around the outer periphery of the chamber 350 on a horizontal line of the bottom surface of the chamber 350.

Figure 12A:
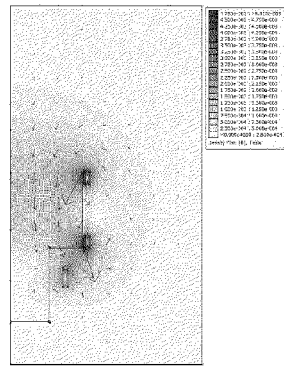
FIGS. 12A to 12C illustrate magnetic flux density distribution diagrams for the second embodiment.
Figure 12B:
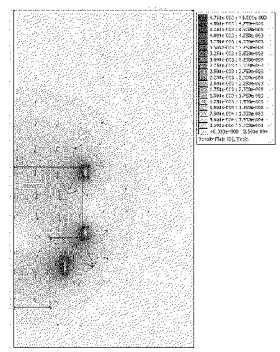
Figure 12C:
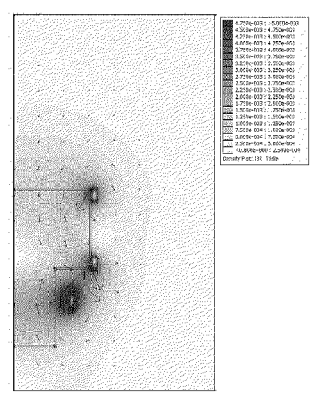
Figure 13A:
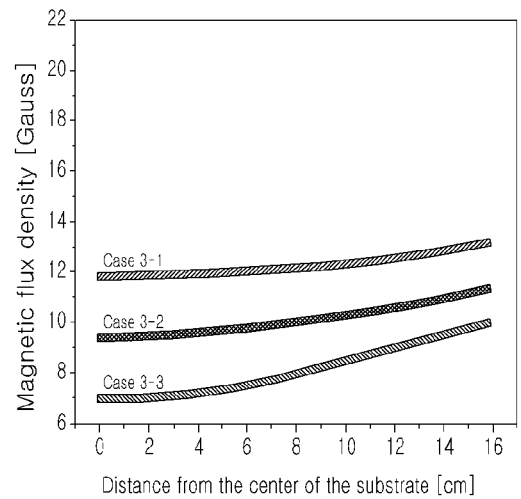
FIGS. 13A and 13B illustrate magnitudes of magnetic field distribution results for the second embodiment.
Figure 13B:
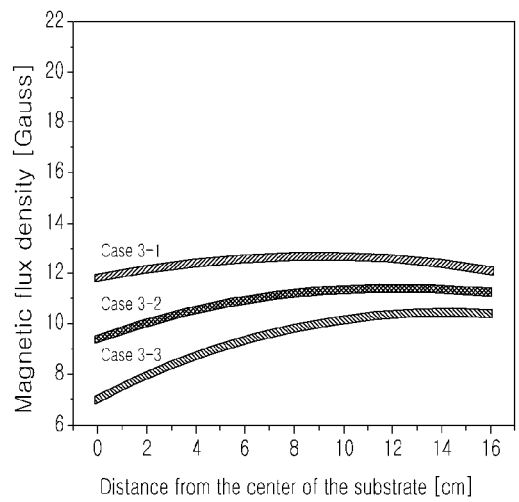

In addition, magnetic flux density distribution diagrams of FIGS. 12A to 12C and magnitudes of magnetic field distribution results of FIGS. 13A and 13B are acquired as a result of measuring the magnetic field distribution in the inner space of the chamber 350 by controlling current input into the first magnetic field generation unit and the second magnetic field generation unit under a current control condition of [Table 4] given below.

TABLE 4

|  | First magnetic field generation conditions | Second magnetic field generation conditions | |
|---|---|---|---|
|  | Lower 2 | Lateral 1 | Lateral 2 |
| Case 3-1 | −250 mA | 500 mA | 500 mA |
| Case 3-2 | −500 mA | 500 mA | 500 mA |
| Case 3-3 | −750 mA | 500 mA | 500 mA |

FIGS. 12A to 12C as magnetic flux density distribution diagrams sequentially corresponding to Case 3-1 to Case 3-3 of [Table 4], respectively illustrate magnetic flux density distributions in a right space when cutting the inner space of the chamber 350 on the vertical axis, and FIG. 13A illustrates a magnetic flux density graph in the horizontal direction based on the substrate and FIG. 13B illustrates a magnetic flux density graph in the vertical direction based on the substrate.

When current supplied to the coil Lower 2 322 of the first magnetic field generation unit is controlled in a reverse direction different from current supplied to the coils Lateral 1 311 and Lateral 2 312 of the second magnetic field generation unit under configuration and current conditions of the plasma processing device 200 according to the Case 3-1 to the Case 3-3, it can be seen that the horizontal and vertical magnetic field intensities gradually increase as illustrated in FIGS. 13A and 13B and it can be seen that the result is similar to the result of controlling the current in terms of the magnetic flux density according to [Table 3] given above in the first embodiment of FIG. 8.

That is, in Case 3 of the second embodiment and Case 2 of the first embodiment, one coil Lower is disposed at different positions on the lower portion of the chamber and the same current control is performed and it can be seen that the horizontal magnetic field intensity continuously increases and further, the vertical magnetic field intensity also gradually increases, and the magnetic flux density is controlled to a minimum of 6 Gauss or more and a maximum of approximately 12 Gauss at the center space of the substrate in both Case 2 and Case 3.

Figure 14:
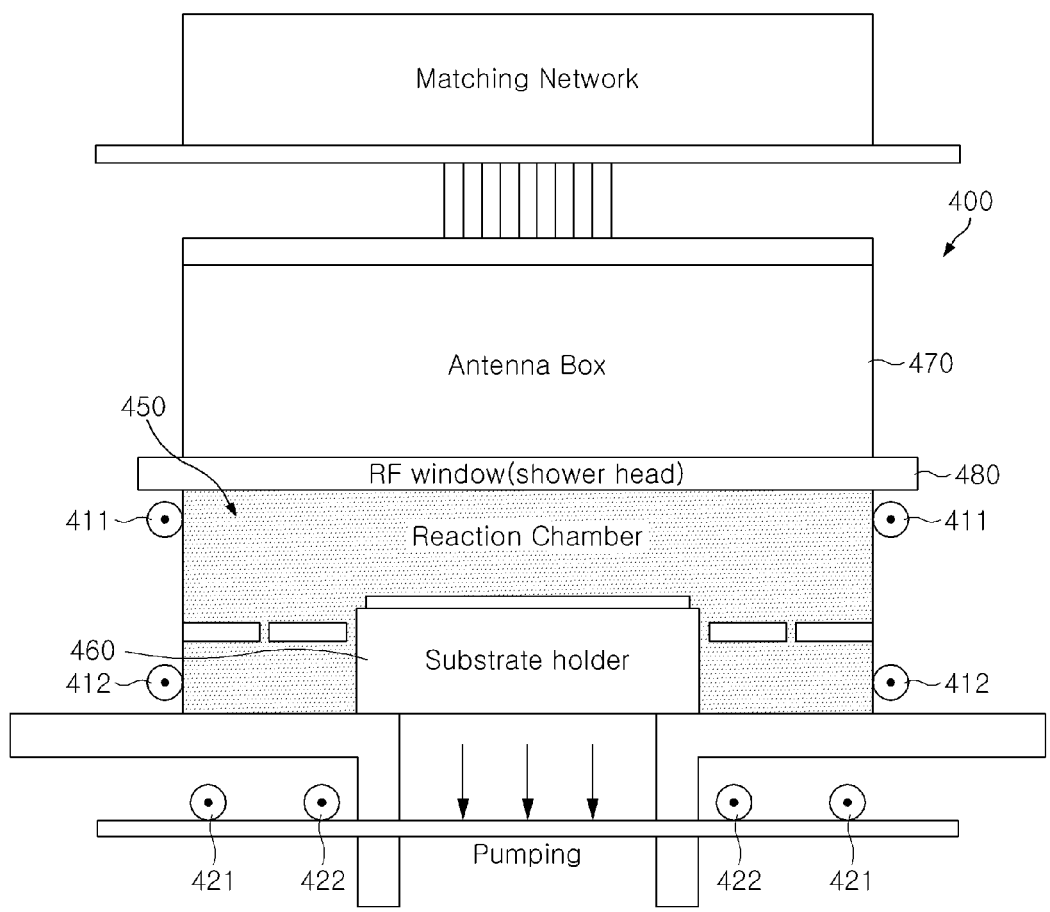
FIG. 14 illustrates a configuration of a third embodiment as one configuration for the plasma processing device according to the present invention.

FIG. 14 illustrates a configuration of Case 4 according to a third embodiment as one example of the plasma processing device according to the present invention.

In a plasma processing device 400 of FIG. 14, as the first magnetic field generation unit, two coils Lower 1 421 and Lower 2 422 are disposed around the intake port of the turbo molecular pump and as the second magnetic field generation unit, coil Lateral 1 411 is disposed around the outer periphery of a chamber 450 on the bottom of an RF window 480 and coil Lateral 2 412 is disposed around the outer periphery of the chamber 450 on a horizontal line of the bottom surface of the chamber 450.

Figure 15A:
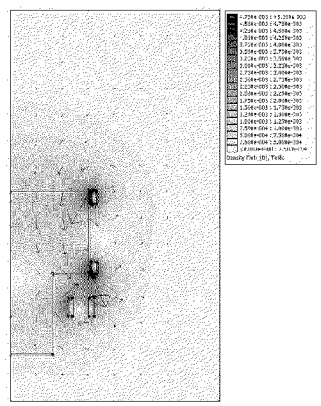
FIGS. 15A to 15C illustrate magnetic flux density distribution diagrams for the third embodiment.
Figure 15B:
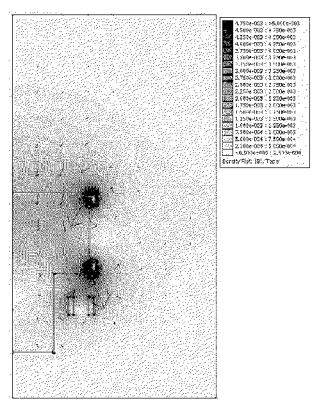
Figure 15C:
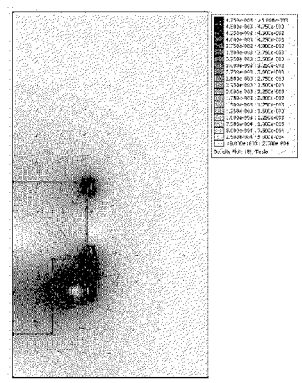
Figure 16A:
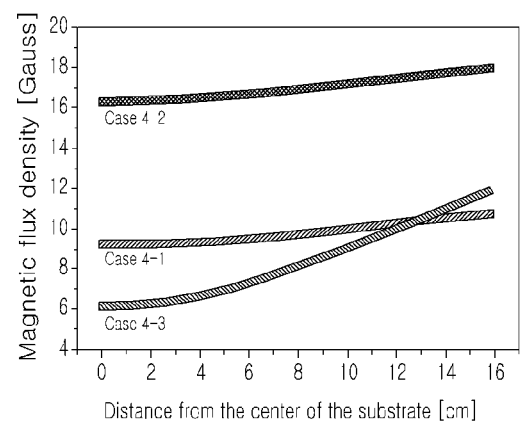
FIGS. 16A and 16B illustrate magnitudes of magnetic field distribution results for the third embodiment.
Figure 16B:
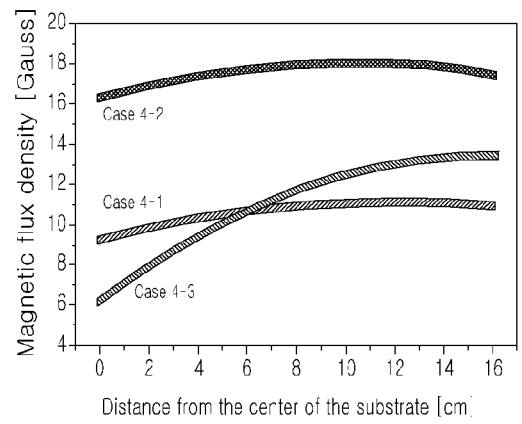

In addition, magnetic flux density distribution diagrams of FIGS. 15A to 15C and magnitudes of magnetic field distribution results of FIGS. 16A and 16B are acquired as a result of measuring the magnetic field distribution in the inner space of the chamber 450 by controlling current input into the first magnetic field generation unit and the second magnetic field generation unit under a current control condition of [Table 5] given below.

TABLE 5

|  | First magnetic field generation conditions | | Second magnetic field generation conditions | |
|---|---|---|---|---|
|  | Lower 1 | Lower 2 | Lateral 1 | Lateral 2 |
| Case 4-1 | −250 mA | −250 mA | 500 mA | 500 mA |
| Case 4-2 | −250 mA | −250 mA | 750 mA | 750 mA |
| Case 4-3 | −750 mA | −750 mA | 750 mA | 750 mA |

FIGS. 15A to 15C as magnetic flux density distribution diagrams sequentially corresponding to Case 4-1 to Case 4-3 of [Table 5], respectively illustrate magnetic flux density distributions in a right space when cutting the inner space of the chamber 450 on the vertical axis, and FIG. 16A illustrates a magnetic flux density graph in the horizontal direction based on the substrate and FIG. 16B illustrates a magnetic flux density graph in the vertical direction based on the substrate.

When current supplied to the coil Lower 1 421 of the first magnetic field generation unit and current supplied to the coil Lower 1 421 and the coil Lower 2 422 of the first magnetic field generation unit are controlled in a reverse direction different from current supplied to the coils Lateral 1 411 and Lateral 2 412 of the second magnetic field generation unit under configuration and current conditions of the plasma processing device 400 according to the Case 4-1 to the Case 4-3, it can be seen that the horizontal magnetic field intensity continuously increases and further, the vertical magnetic field intensity also gradually increases as illustrated in FIG. 16, and the magnetic flux density is controlled with a minimum of 6 Gauss or more and a maximum of approximately 16 Gauss at the center space of the substrate. In particular as shown in the result of the Case 4-3, it can be seen that when larger current is supplied, the horizontal and vertical magnetic field intensities rapidly increase.

Figure 17:
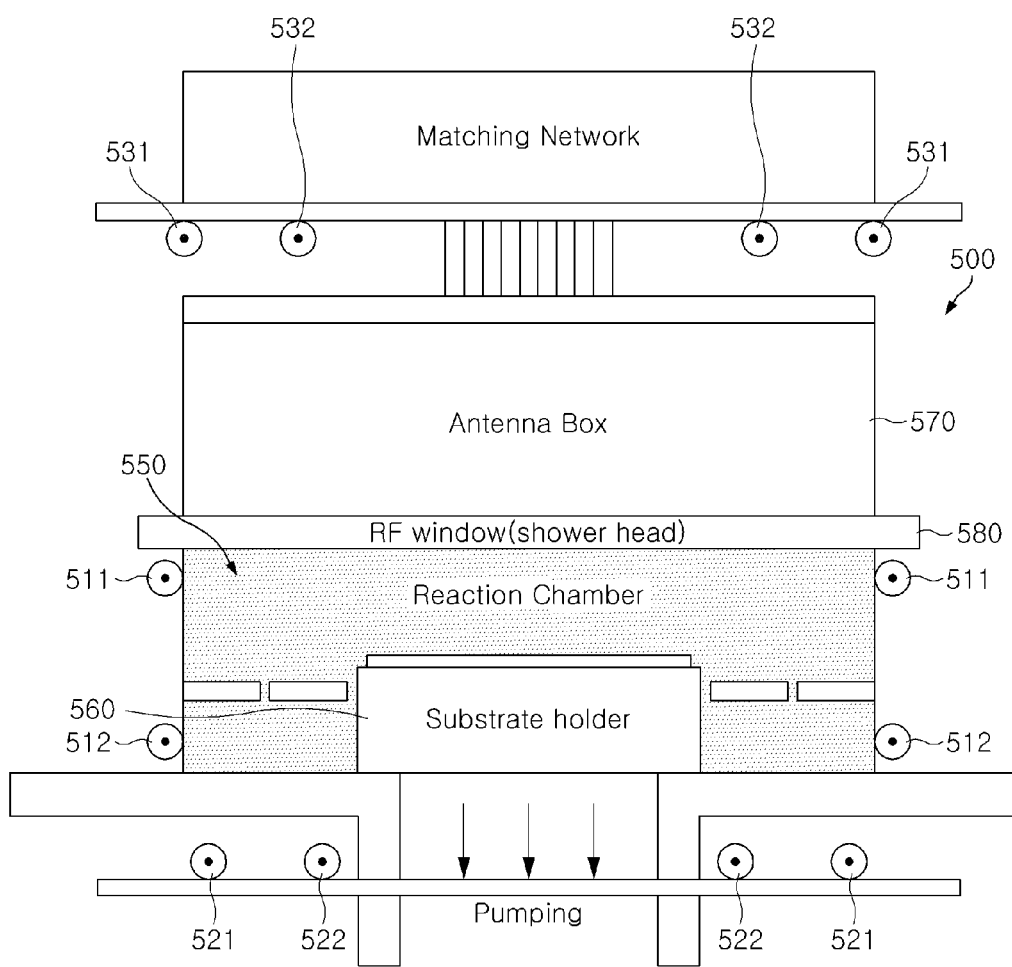
FIG. 17 illustrates a configuration of a fourth embodiment as one configuration for the plasma processing device according to the present invention.

FIG. 17 illustrates a configuration of Case 5 according to a fourth embodiment as one example of the plasma processing device according to the present invention.

In a plasma processing device 500 of FIG. 17, as the first magnetic field generation unit, two coils Lower 1 521 and Lower 2 522 are disposed around the intake port of the turbo molecular pump and as the second magnetic field generation unit, coil Lateral 1 511 is disposed around the outer periphery of a chamber 550 on the bottom of an RF window 580 and coil Lateral 2 512 is disposed around the outer periphery of the chamber 550 on a horizontal line of the bottom surface of the chamber 550. Additionally, as the third magnetic field generation unit, two coils Upper 1 531 and Upper 2 532 are disposed on the upper portion of an antenna box 570 on the top of the chamber 550.

Figure 18A:
FIGS. 18A to 18C illustrate magnetic flux density distribution diagrams for the fourth embodiment.
Figure 18B:
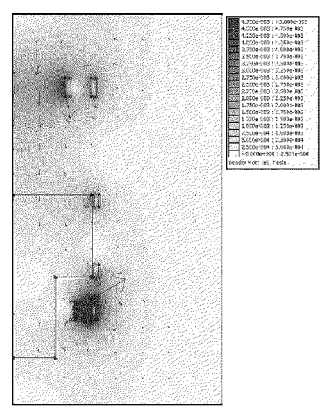
Figure 18C:
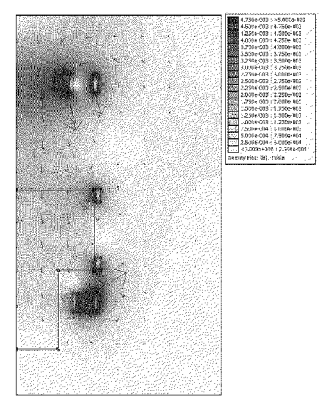
Figure 19A:
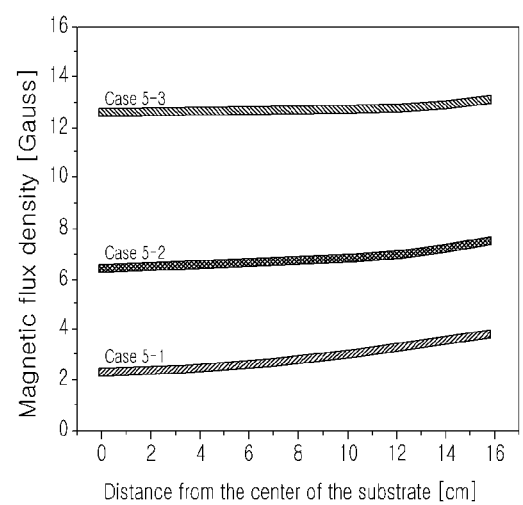
FIGS. 19A and 19B illustrate magnitudes of magnetic field distribution results for the fourth embodiment.
Figure 19B:
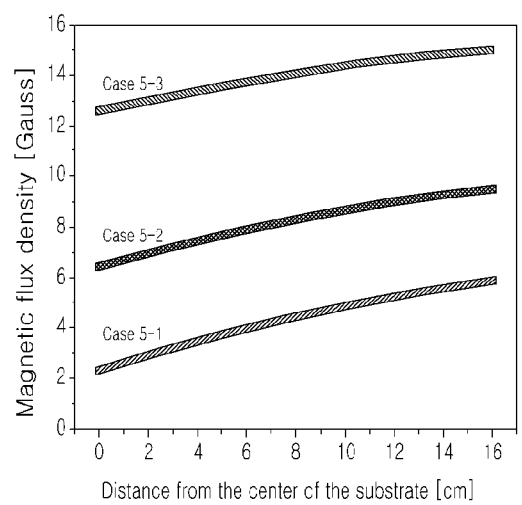

In addition, magnetic flux density distribution diagrams of FIGS. 18A to 18C and magnitudes of magnetic field distribution results of FIGS. 19A and 19B are acquired as a result of measuring the magnetic field distribution in the inner space of the chamber 550 by controlling current input into the first magnetic field generation unit, the second magnetic field generation unit, and the third magnetic field generation unit under a current control condition of [Table 6] given below.

TABLE 6

|  | First magnetic field generation conditions | | Second magnetic field generation conditions | | Third magnetic field generation conditions | |
| --- | --- | --- | --- | --- | --- | --- |
|  | Lower 1 | Lower 2 | Lateral 1 | Lateral 2 | Upper 1 | Upper 2 |
| Case 5-1 | −750 mA | 250 mA | 250 mA | 250 mA | 250 mA | 250 mA |
| Case 5-2 | −750 mA | 350 mA | 350 mA | 350 mA | 350 mA | 350 mA |
| Case 5-3 | −750 mA | 500 mA | 500 mA | 500 mA | 500 mA | 500 mA |

FIGS. 18A to 18C as magnetic flux density distribution diagrams sequentially corresponding to Case 5-1 to Case 5-3 of [Table 6], respectively illustrate magnetic flux density distributions in a right space when cutting the inner space of the chamber 550 on the vertical axis, and FIG. 19A illustrates a magnetic flux density graph in the horizontal direction based on the substrate and FIG. 19B illustrates a magnetic flux density graph in the vertical direction based on the substrate.

When current supplied to the coil Lower 1 521 of the first magnetic field generation unit is controlled in a reverse direction different from current supplied to the coil Lower 2 522 of the first magnetic field generation unit, the coils Lateral 1 511 and Lateral 2 512 of the second magnetic field generation unit, and the coils Upper 1 531 and Upper 2 532 of the third magnetic field generation unit under configuration and current conditions of the plasma processing device 400 according to the Case 5-1 to the Case 5-3, it can be seen that both the horizontal and vertical magnetic field intensities continuously increase as illustrated in FIGS. 19A and 19B. Although the magnetic flux density is controlled to be slightly low with approximately 2 Gauss at the center space of the substrate in the case of the Case 5-1, the magnetic flux density may be maintained at a predetermined level or more and in particular, it can be seen that the third magnetic field generation unit is added to reinforce the magnetic field in the inner space of the chamber 550, and as a result, the vertical magnetic field intensity rapidly increases.

In a configuration of Case 6 according to a fifth embodiment as one configuration for the plasma processing device according to the present invention, similarly to FIG. 17, as the first magnetic field generation unit, two coils Lower 1 521 and Lower 2 522 are disposed around the intake port of the turbo molecular pump and as the second magnetic field generation unit, coil Lateral 1 511 is disposed around the outer periphery of the chamber 550 on the bottom of the RF window 580 and coil Lateral 2 512 is disposed around the outer periphery of the chamber 550 on a horizontal line of the bottom surface of the chamber 550. Additionally, as the third magnetic field generation unit, two coils Upper 1 531 and Upper 2 532 are disposed on the upper portion of the antenna box 570 on the top of the chamber 550.

Figure 20A:
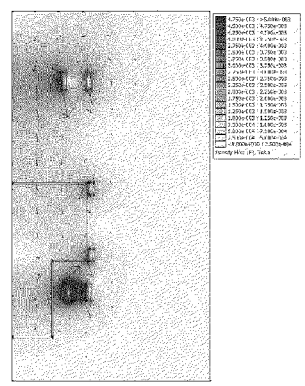
FIGS. 20A to 20C illustrate magnetic flux density distribution diagrams for a fifth embodiment according to the present invention.
Figure 20B:
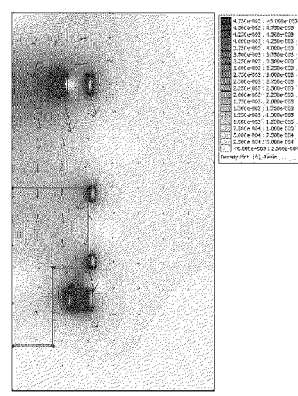
Figure 20C:
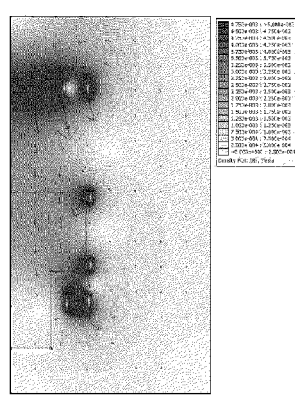
Figure 21A:
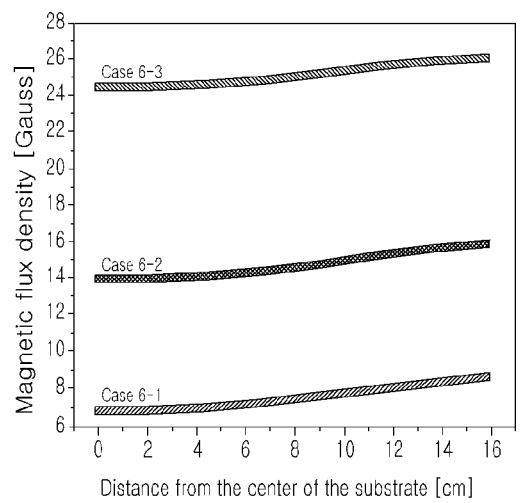
FIGS. 21A and 21B illustrate magnitudes of magnetic field distribution results for the fifth embodiment according to the present invention.
Figure 21B:
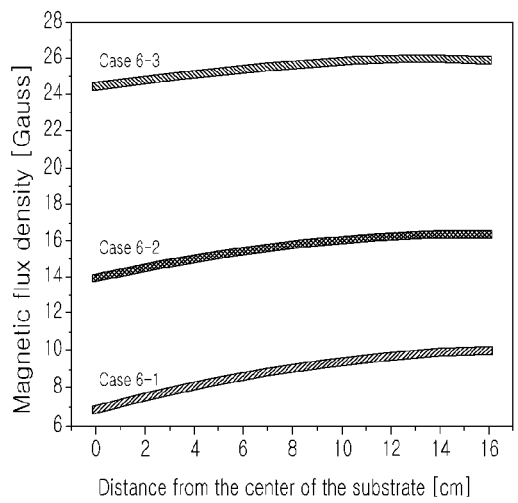

In addition, differently from FIG. 17, magnetic flux density distribution diagrams of FIGS. 20A to 20C and magnitudes of magnetic field distribution results of FIGS. 21A and 21B are acquired as a result of measuring the magnetic field distribution in the inner space of the chamber 550 by controlling current input into the first magnetic field generation unit, the second magnetic field generation unit, and the third magnetic field generation unit under a current control condition of [Table 7] given below.

TABLE 7

|  | First magnetic field generation conditions | | Second magnetic field generation conditions | | Third magnetic field generation conditions | |
| --- | --- | --- | --- | --- | --- | --- |
|  | Lower 1 | Lower 2 | Lateral 1 | Lateral 2 | Upper 1 | Upper 2 |
| Case 6-1 | 330 mA | −750 mA | 330 mA | 330 mA | 330 mA | 330 mA |
| Case 6-2 | 500 mA | −750 mA | 050 mA | 500 mA | 500 mA | 500 mA |
| Case 6-3 | 750 mA | −750 mA | 750 mA | 750 mA | 750 mA | 750 mA |

FIGS. 20A to 20C as magnetic flux density distribution diagrams sequentially corresponding to Case 6-1 to Case 6-3 of [Table 7], respectively illustrate magnetic flux density distributions in a right space when cutting the inner space of the chamber 550 on the vertical axis, and FIG. 21A illustrates a magnetic flux density graph in the horizontal direction based on the substrate and FIG. 21B illustrates a magnetic flux density graph in the vertical direction based on the substrate.

A result similar to the current control condition of [Table 6] is acquired as a result of applying the current control condition of [Table 7], that is, when current supplied to the coil Lower 2 522 of the first magnetic field generation unit is controlled in a reverse direction different from current supplied to the coil Lower 1 521 of the first magnetic field generation unit, the coils Lateral 511 and Lateral 2 512 of the second magnetic field generation unit, and the coils Upper 1 531 and Upper 2 532 of the third magnetic field generation unit, it can be seen that both the horizontal and vertical magnetic field intensities continuously increase as illustrated in FIGS. 21A and 21B and it can be seen that the magnetic flux density is controlled to a minimum of 6 Gauss or more and a maximum of approximately 16 Gauss at the center space of the substrate.

Meanwhile, as a second comparative example compared with the plasma processing device according to the present invention, in a configuration of Case 7, the first magnetic field generation unit and the second magnetic field generation unit are disposed and additionally, the third magnetic field generation unit is disposed similarly to FIG. 17.

Figure 22:
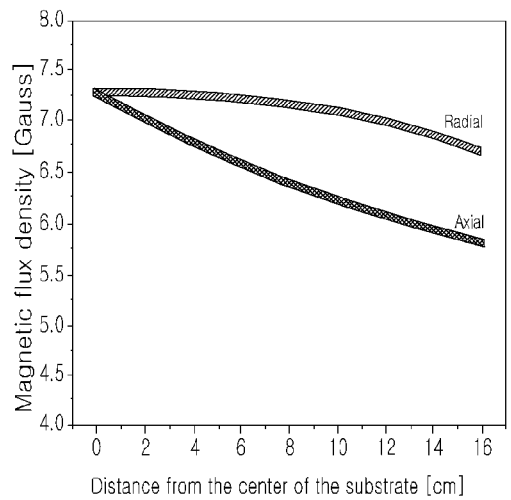
FIG. 22 illustrates a magnetic flux density distribution diagram for a second comparative example compared with the plasma processing device according to the present invention.
Figure 23:
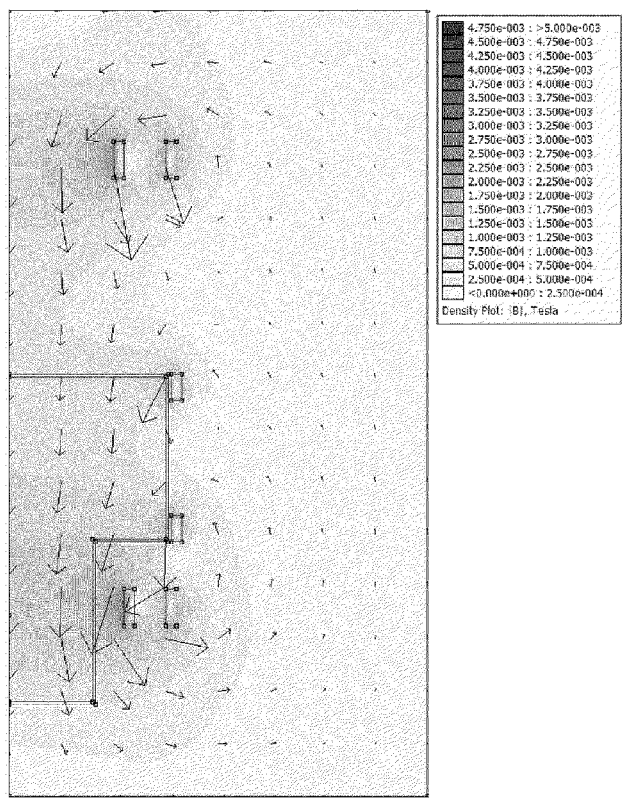
FIG. 23 illustrates a magnitude of magnetic field distribution result for the second comparative example compared with the plasma processing device according to the present invention.
Figure 25A:
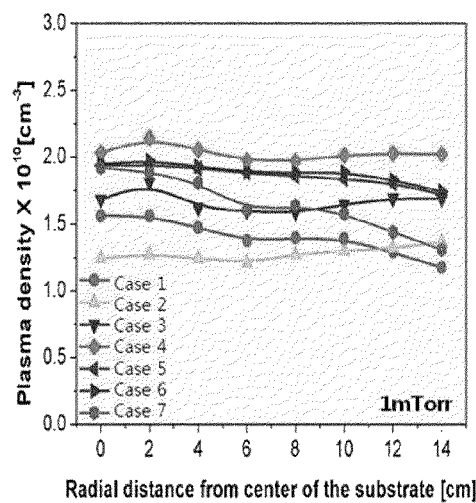
FIGS. 25A to 29 illustrate an experimental result of measuring a plasma density and an electron temperature under the control condition of FIG. 24.
Figure 25B:
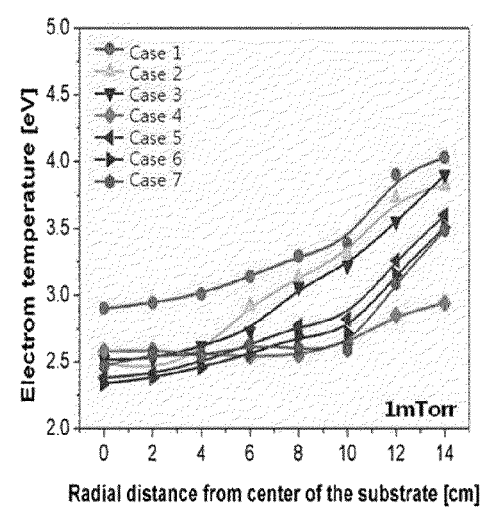
Figure 26A:
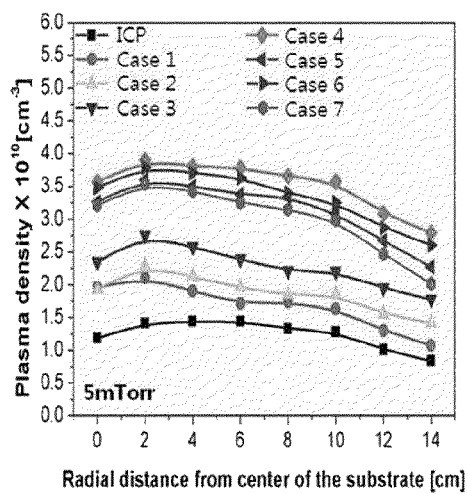
Figure 26B:
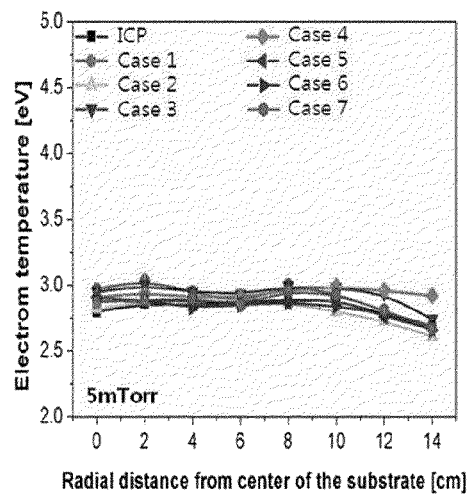
Figure 27A:
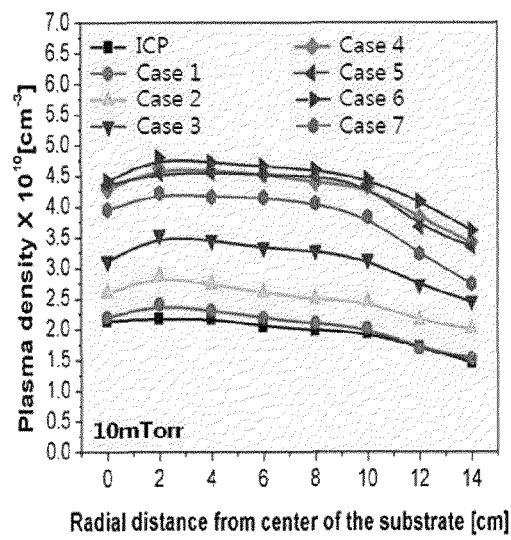
Figure 27B:
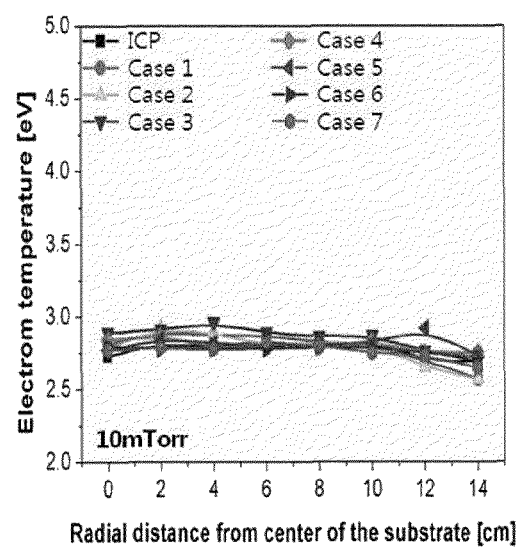

In addition, differently from FIG. 17, a magnetic flux density distribution diagram of FIG. 22 and a magnitude of magnetic field distribution result of FIG. 23 are acquired as a result of measuring the magnetic field distribution in the inner space of the chamber 550 by controlling current input into the first magnetic field generation unit, the second magnetic field generation unit, and the third magnetic field generation unit under a current control condition of [Table 8] given below.

TABLE 8

| | First magnetic field generation conditions | | Second magnetic field generation conditions | | Third magnetic field generation conditions | |
|---|---|---|---|---|---|---|
| | Lower 1 | Lower 2 | Lateral 1 | Lateral 2 | Upper 1 | Upper 2 |
| Case 7 | 140 mA | 140 mA | 140 mA | 140 mA | 140 mA | 140 mA |

FIG. 22 as a magnetic flux density distribution diagram corresponding to Case 7 of [Table 8] illustrates a magnetic flux density distribution in a right space when cutting the inner space of the chamber 550 on the vertical axis, and in FIG. 23, Radial represents a magnetic flux density graph in the horizontal direction based on the substrate and Axial represents a magnetic flux density graph in the vertical direction based on the substrate.

It can be seen that as a result of supplying current in the same current direction, that is, the forward direction to all of the first, second, and third magnetic field generation units according to the current control condition of [Table 8], it can be seen that the magnetic field intensities decrease in both the horizontal and vertical directions as illustrated in FIG. 23. That is, when the current input into all of the first, second, and third magnetic field generation units is controlled in the same direction, the magnetic fields in both the horizontal and vertical directions are reduced, and as a result, the flute instability phenomenon occurs. Therefore, the plasma density may not be uniformly formed in the entire effective plasma space.

The results according to the representative control condition in the case of each of the first and second comparative examples and the first to fifth embodiments are organized in FIG. 24 and it can be verified that when the magnetic intensity B at the center of the substrate is the same as 7 Gauss in all of the first and second comparative examples and the first to fifth embodiments, both the intensities of the horizontal magnetic field B (Radial) and the vertical magnetic field B (Axial) increase in the case of the first to fifth embodiments according to the present invention, which control the current supplied to at least one coil among the coils included in the first magnetic field generation unit in the opposite direction to the current supplied to the residual coils.

Furthermore, when the first, second, and third magnetic field generation units are controlled under the control condition of FIG. 24, a result of performing an experiment for measuring the plasma density and the electron temperature in the space of the chamber is illustrated in FIGS. 25A to 29.

FIGS. 25A to 27B illustrate a result of measuring the plasma density and the plasma electron temperature with respect to respective cases of process pressures of 1 mTorr, 5 mTorr, and 10 mTorr based on a height of 0.8 cm from the substrate in the chamber (based on process gas: Ar and plasma source power: 1000 W). As illustrated in FIGS. 25A to 27B, in the cases of Case 4, Case 5, and Case 6 which are an embodiment of the present invention that controls a current supply direction of at least electromagnetic coil included in the first magnetic field generation unit differently from current supply directions of residual other electromagnetic coils, it can be seen that horizontal plasma uniformity is also improved while the plasma density increases. On the contrary, in Cases 1 and 7 which are cases of the comparative example that controls all current supply directions of the magnetic field generation units in the same direction, it can be seen that there is no increase effect of the plasma density and the uniformity characteristic of the plasma is also bad.

When the electron temperature is excessively high, charging of electrons in an etching mask becomes severe, and as a result, ions may not be incident vertically, but is biased. Therefore, etching may not be vertically achieved and in all cases of FIGS. 26A to 27B, a difference in electron temperature is not significantly generated, but in the case (1 mTorr) of FIGS. 25A and 25B, it can be seen that the cases of Case 4, Case 5, and Case 6 which are an embodiment of the present invention are more stable.

Figure 28A:
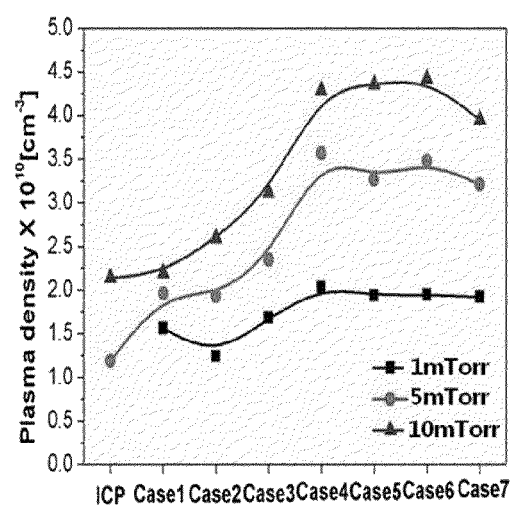
Figure 28B:
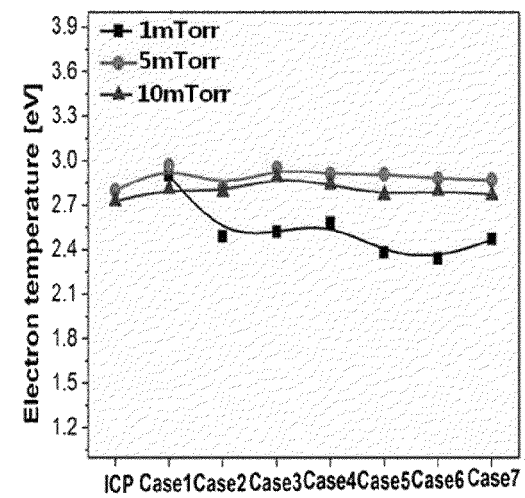

Further, FIGS. 28A and 28B illustrate the result of measuring the plasma density and the electron temperature based on the center of the substrate in each case and as illustrated in FIGS. 28A and 28B, it can be seen that in the cases of Case 4, Case 5, and Case 6 which are an embodiment of the present invention, the plasma density is relatively improved and the electron temperature is also stable.

Figure 29:
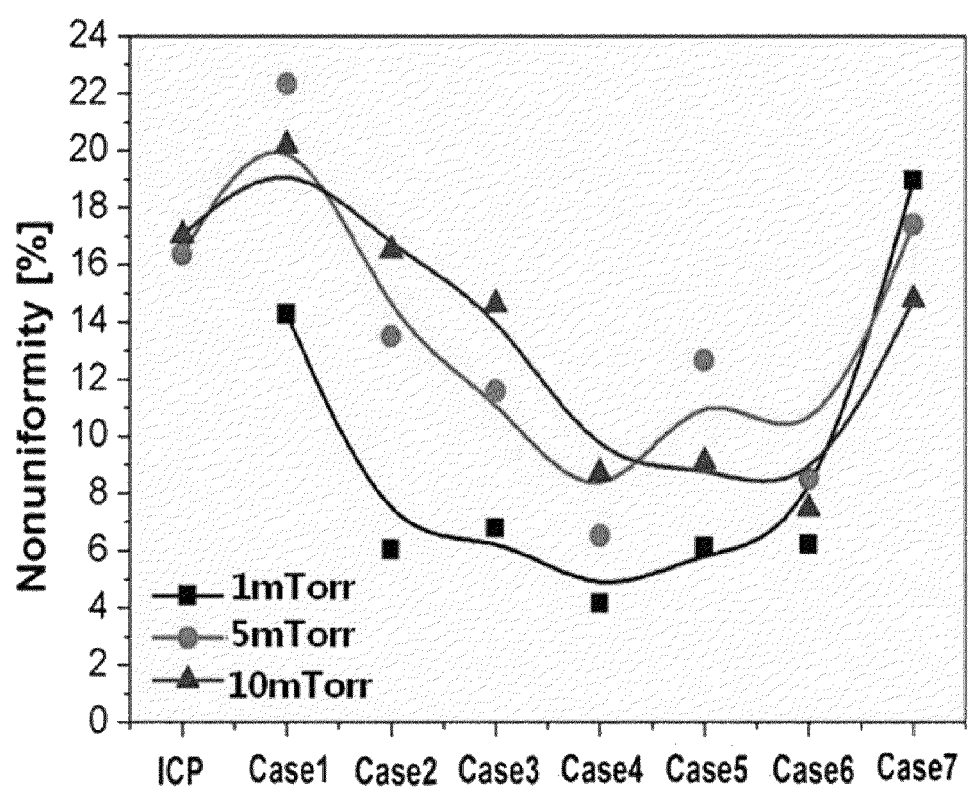

Furthermore, FIG. 29 illustrates non-uniformity of the plasma density in the horizontal direction in the inner space of the chamber and the plasma non-uniformity in the radial direction may be expressed by [Equation 3] given below and the uniformity of the plasma density is expressed by (100−non-uniformity).

That is, as the non-uniformity is high, the plasma is distributed non-uniformly in the radial direction.

$$\text{Non-uniformity} = \frac{n_{max} - n_{min}}{n_{max} + n_{min}} \times 100 \qquad \text{[Equation 3]}$$

where $n_{max}$ represents a maximum plasma density and $n_{min}$ represents a minimum plasma density.

Reviewing the non-uniformity illustrated in FIG. 29, since the non-uniformity is relatively low in the cases of Case 4, Case 5, and Case 6 which are an embodiment of the present invention, it can be seen that the plasma density in the horizontal direction is more uniform.

In particular, as compared with the ICP to which the magnetic field is not applied, in the cases of Case 1 and Case 7 which are the comparative examples of supplying the current to all electromagnetic coils in the same direction while applying the magnetic field, it can be seen that the uniformity deteriorates due to the increase in non-uniformity and contrary to this, when the current is supplied to at least one electromagnetic coil in the opposite direction to other electromagnetic coils, can be seen a result that the magnetic field intensity increases as being farther from the center of the chamber in the horizontal direction and the uniformity is enhanced.

As described above, in the embodiments of the present invention, it has been described that the first magnetic field generation unit includes one or two electromagnetic coils and each of the second magnetic field generation unit and the third magnetic field generation unit also includes two electromagnetic coils, but this is used for easily describing an operating principle and an effect according to the present invention and each of the first to third magnetic field generation units may be modified to selectively include only one electromagnetic coil or three or more electromagnetic coils according to a situation.

According to the present invention, through the configuration of controlling the magnetic field to increase the intensity of the magnetic field in proportion to the distance in the outward horizontal direction based on the substrate in the inner space of the chamber in order to remove the occurrence of the flute instability and to increase the intensity of the magnetic field in proportion to the distance in the upward vertical direction based on the substrate to propagate an R-wave into a chamber, the uniformity of the plasma is improved in the entire inner space of the chamber, and as a result, a plasma process having high reliability can be performed even around the outer periphery of a substrate and in particular, a plasma process for a large-area substrate can be more stably performed.

The above description just illustrates the technical spirit of the present invention and various modifications and transformations can be made to those skilled in the art without departing from an essential characteristic of the present invention. Therefore, the embodiments disclosed in the present invention are used not to limit but to describe the technical spirit of the present invention. The technical spirit of the present invention is not limited to the embodiments. The scope of the present invention should be construed by the appended claims and it should be construed that all technical spirit in the equivalent range thereto is intended to be embraced by the present invention.

The invention claimed is:

1. A plasma processing device comprising:
   a vacuum chamber having an inner space on which a substrate is mounted;
   an antenna positioned on an upper portion of the chamber and generating plasma in the inner space of the chamber;
   a magnetic field generation unit including a first magnetic field generation unit disposed on a lower portion of the chamber and including one or more electromagnetic coils and a second magnetic field generation unit including one or more electromagnetic coils disposed on the side of the chamber; and
   a control unit controlling current input into the respective electromagnetic coils of the magnetic field generation unit so as to continuously increase the intensity of the magnetic field in proportion to the distance in the outward direction in a horizontal space and increase the intensity of the magnetic field in proportion to the distance in the upward direction in a vertical space in an effective plasma space of the chamber based on the center of the substrate mounted in the chamber,
   wherein the control unit controls current input into at least one coil among the coils of the first magnetic field generation unit in an opposite direction to current input into the coils of the second magnetic field generation unit.

2. The plasma processing device of claim 1, wherein the control unit controls the current input into the respective electromagnetic coils so as to generate a predetermined magnetic field intensity at the center of the substrate in the effective plasma space of the chamber.

3. The plasma processing device of claim 1, wherein the first magnetic field generation unit includes a plurality of electromagnetic coils disposed on the bottom of the chamber, and
   the respective electromagnetic coils of the first magnetic field generation unit are installed to be spaced apart from each other outside the bottom of the substrate mounted in the chamber to sequentially have larger radii.

4. The plasma processing device of claim 1, wherein
   the second magnetic field generation unit includes
   a plurality of electromagnetic coils disposed to be spaced apart from each other in a vertical direction of the chamber to surround the periphery of the side of the chamber.

5. The plasma processing device of claim 1, further comprising:
   a third magnetic field generation unit disposed on the upper portion of the chamber and including one or more electromagnetic coils.

6. The plasma processing device of claim 1, wherein the plurality of electromagnetic coils of the second magnetic field generation unit is installed within a range from the outer periphery of an RF window provided on the top of the chamber to a horizontal space of the bottom of the chamber.

7. The plasma processing device of claim 5, wherein the control unit controls current input into the electromagnetic coils of the third magnetic field generation unit in the same direction as current input into the electromagnetic coils of the second magnetic field generation unit.

8. The plasma processing device of claim 1, wherein the control unit controls current input into at least one coil selected among the plurality of coils included in the first magnetic field generation unit in an opposite direction to current input into the residual coils among the plurality of coils included in the first magnetic field generation unit.

* * * * *